United States Patent
Zhu et al.

(10) Patent No.: US 11,205,659 B2
(45) Date of Patent: Dec. 21, 2021

(54) INTERCONNECT STRUCTURES OF THREE-DIMENSIONAL MEMORY DEVICES

(71) Applicant: YANGTZE MEMORY TECHNOLOGIES CO., LTD., Wuhan (CN)

(72) Inventors: Hongbin Zhu, Wuhan (CN); Juan Tang, Wuhan (CN); Wei Xu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 55 days.

(21) Appl. No.: 16/576,641

(22) Filed: Sep. 19, 2019

(65) Prior Publication Data
US 2021/0020653 A1 Jan. 21, 2021

Related U.S. Application Data

(63) Continuation of application No. PCT/CN2019/096123, filed on Jul. 16, 2019.

(51) Int. Cl.
| | |
|---|---|
| *H01L 27/11582* | (2017.01) |
| *G11C 5/02* | (2006.01) |
| *G11C 5/06* | (2006.01) |
| *G11C 16/04* | (2006.01) |
| *H01L 27/11556* | (2017.01) |

(52) U.S. Cl.
CPC ......... *H01L 27/11582* (2013.01); *G11C 5/02* (2013.01); *G11C 5/06* (2013.01); *G11C 16/04* (2013.01); *H01L 27/11556* (2013.01)

(58) Field of Classification Search
None
See application file for complete search history.

(56) References Cited

U.S. PATENT DOCUMENTS

| | | | | |
|---|---|---|---|---|
| 9,478,495 | B1 * | 10/2016 | Pachamuthu | ..... H01L 21/76844 |
| 9,786,673 | B1 * | 10/2017 | Cho | ................... H01L 27/11582 |
| 9,953,997 | B2 * | 4/2018 | Park | ...................... H01L 23/528 |

(Continued)

FOREIGN PATENT DOCUMENTS

| | | |
|---|---|---|
| CN | 105047668 A | 11/2015 |
| CN | 106992184 A | 7/2017 |

(Continued)

OTHER PUBLICATIONS

International Search Report issued in corresponding International Application No. PCT/CN2019/096123, dated Apr. 15, 2020, 5 pages.

(Continued)

*Primary Examiner* — Long Pham
(74) *Attorney, Agent, or Firm* — Bayes PLLC

(57) ABSTRACT

Embodiments of 3D memory devices and methods for forming the same are disclosed. In an example, a 3D memory device includes a substrate, a memory stack, a channel structure, and a slit structure. The memory stack includes interleaved conductive layers and dielectric layers above the substrate. The channel structure extends vertically through the memory stack. The slit structure extends vertically through the memory stack. An upper end of the slit structure is above an upper end of the channel structure.

11 Claims, 19 Drawing Sheets

(56) References Cited

U.S. PATENT DOCUMENTS

| | | | |
|---|---|---|---|
| 2012/0001249 A1* | 1/2012 | Alsmeier | H01L 27/1157 257/319 |
| 2016/0043100 A1* | 2/2016 | Lee | H01L 27/11565 257/324 |
| 2016/0204122 A1* | 7/2016 | Shoji | H01L 27/11575 257/324 |
| 2016/0365351 A1* | 12/2016 | Nishikawa | H01L 27/1157 |
| 2017/0062472 A1 | 3/2017 | Park et al. | |
| 2017/0133389 A1 | 5/2017 | Yun et al. | |

FOREIGN PATENT DOCUMENTS

| | | |
|---|---|---|
| CN | 107731838 A | 2/2018 |
| CN | 107887395 A | 4/2018 |
| CN | 108140643 A | 6/2018 |
| CN | 109219885 A | 1/2019 |
| CN | 109817536 A | 5/2019 |
| TW | 201042759 A | 12/2010 |
| TW | I665763 B | 7/2019 |

OTHER PUBLICATIONS

Written Opinion of the International Searching Authority issued in corresponding International Application No. PCT/CN2019/096123, dated Apr. 15, 2020, 5 pages.

\* cited by examiner

INTERCONNECT STRUCTURES OF THREE-DIMENSIONAL MEMORY DEVICES

CROSS-REFERENCE TO RELATED APPLICATIONS

This application is a continuation of International Application No. PCT/CN2019/096123, filed on Jul. 16, 2019, entitled "INTERCONNECT STRUCTURES OF THREE-DIMENSIONAL MEMORY DEVICES," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a 3D memory device includes a substrate, a memory stack, a channel structure, and a slit structure. The memory stack includes interleaved conductive layers and dielectric layers above the substrate. The channel structure extends vertically through the memory stack. The slit structure extends vertically through the memory stack. An upper end of the slit structure is above an upper end of the channel structure.

In another example, a method for forming a 3D memory device is disclosed. A dielectric stack including interleaved sacrificial layers and dielectric layers is formed above a substrate. A channel structure extending vertically through the dielectric stack is formed. A local dielectric layer is formed on the dielectric stack. A channel local contact opening through the local dielectric layer to expose an upper end of the channel structure, and a slit opening extending vertically through the local dielectric layer and the dielectric stack are simultaneously formed. A memory stack including interleaved conductive layers and the dielectric layers is formed by replacing, through the slit opening, the sacrificial layers with the conductive layers. A channel local contact in the channel local contact opening, and a slit structure in the slit opening are simultaneously formed.

In still another example, a method for forming a 3D memory device is disclosed. A dielectric stack including interleaved sacrificial layers and dielectric layers is formed above a substrate. A channel structure extending vertically through the dielectric stack is formed. A local contact layer is formed on the dielectric stack. The local contact layer includes a channel local contact above and in contact with an upper end of the channel structure. A first dielectric layer is formed on the local contact layer. A channel contact opening through the first dielectric layer to expose an upper end of the channel local contact, and a slit opening extending vertically through the first dielectric layer, the local contact layer, and the dielectric stack are simultaneously formed. A memory stack including interleaved conductive layers and the dielectric layers is formed by replacing, through the slit opening, the sacrificial layers with the conductive layers. A channel contact in the channel contact opening, and a slit structure in the slit opening are simultaneously formed.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
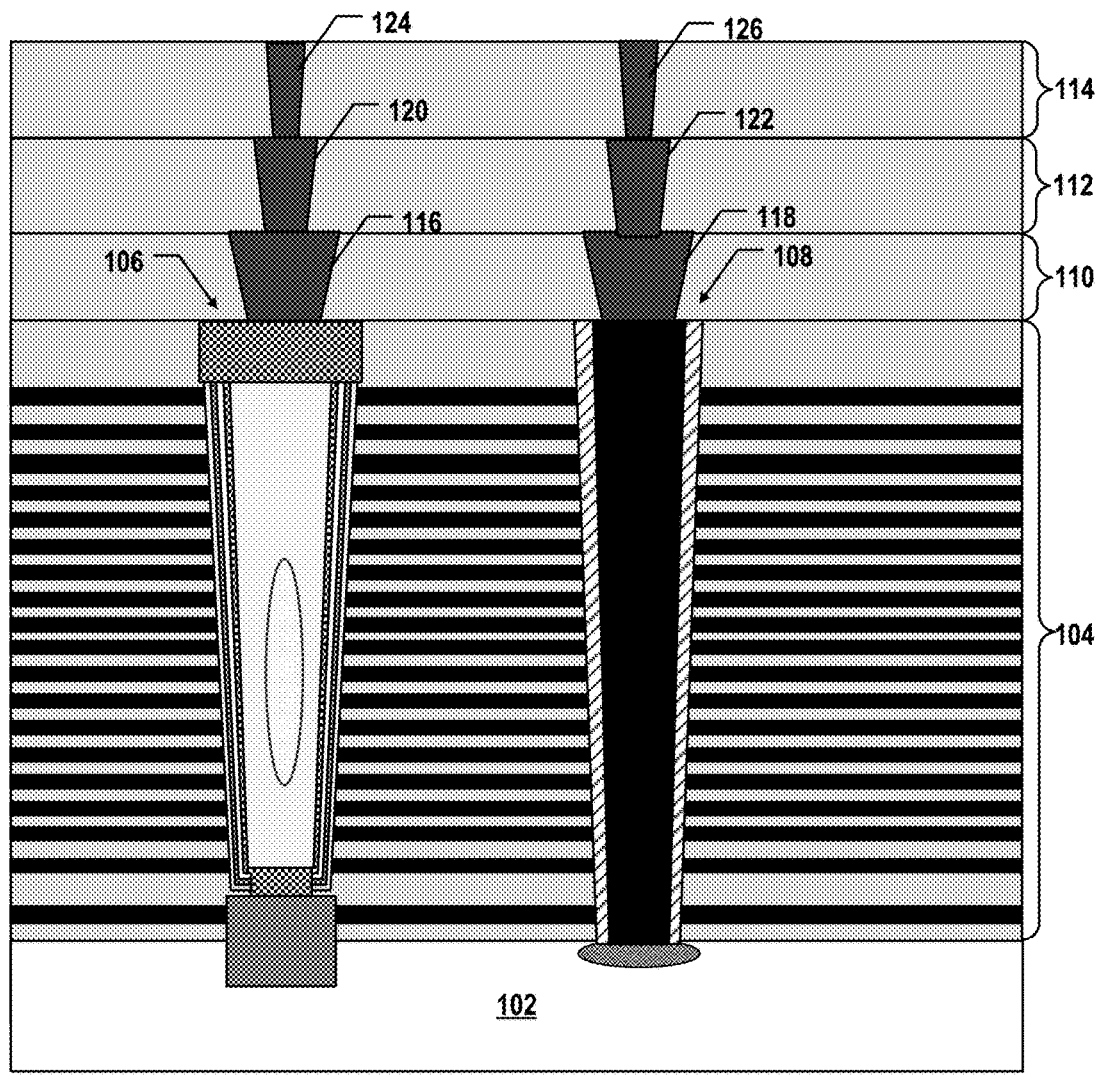
FIG. 1 illustrates a cross-section of a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more"

as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, such as 3D NAND memory devices, a slit structure is used for various functions including separating the memory array into multiple blocks, providing access for the etchant and chemical precursor during a gate replacement process, and providing an electrical connection to the source of the memory array. FIG. 1 illustrates a cross-section of a 3D memory device 100. As illustrated in FIG. 1, 3D memory device 100 includes a memory stack 104 above a substrate 102. 3D memory device 100 also includes a channel structure 106 and a slit structure 108 each extending vertically through memory stack 104. In a NAND Flash memory device, channel structure 106 functions as a NAND memory string, and slit structure 108 functions as an electrical connection to the source of the NAND memory string, for example, an array common source (ACS) of an array of channel structures 106.

3D memory device 100 further includes an interconnect structure for channel structure 106 and slit structure 108 above memory stack 104, which includes a local contact layer 110 on memory stack 104, a first interconnect layer 112 on local contact layer 110, and a second interconnect layer 114 on first interconnect layer 112. It is noted that x and y axes are included in FIG. 1 to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing the spatial relationship is applied throughout the present disclosure.

Local contact layer 110 includes local contacts (also known as "C1") that are in contact with a structure in memory stack 104 directly, including a channel local contact 116 in contact with channel structure 106 and a slit local contact 118 in contact with slit structure 108. First interconnect layer 112 includes contacts (also known as "V0") that are in contact with local contact layer 110, such as a channel contact 120 in contact with channel local contact 116 and a slit contact 122 in contact with slit local contact 118. Second interconnect layer 114 includes interconnect lines (also known as "M1") each of which is in contact with a plurality of contacts in first interconnect layer 112, such as a bit line 124 in contact with channel contacts 120 of a plurality of channel structures 106 and a source line 126 in contact with slit contacts 122 of a plurality of slit structures 108.

In forming 3D memory device 100, slit structure 108 is formed prior to the formation of the interconnect structure (e.g., the formation of channel local contact 116 in local contact layer 110). As a result, the upper ends of channel structure 106 and slit structure 108 are flush with one another, as shown in FIG. 1. As the upper end of slit structure 108 is below local contact layer 110, additional interconnects (i.e., slit local contact 118 and slit contact 122) need to be formed between source line 126 and slit structure 108 to electrically connect slit structure 108 to source line 126. These interconnects for slit structure 108 (e.g., slit local contact 118 and/or slit contact 122), however, make the overlay control more complicated. Also, the number and density of the interconnects for slit structure 108 is also limited to save memory cell area, which in turn affect the resistance of the interconnect structure. Moreover, the slit opening for forming slit structure 108 tends to collapse as its depth increases, thereby reducing the yield.

Various embodiments in accordance with the present disclosure provide 3D memory devices with improved interconnect structures. By moving the step of forming the slit structure later in the fabrication processes (i.e., after the formation of the channel local contact), one or more of the interconnects for the slit structure (e.g., the slit local contact and/or slit contact) are no longer needed, which reduces the complexity of overlay control. As a result, the slit structure can extend through the local contact layer to contact the slit contact in the first interconnect layer directly, or even further through the first interconnect layer to contact the source line in the second interconnect layer directly. Compared with multiple discrete via contacts (e.g., slit local contact 118 and/or slit contact 122), the continuous, trench-like conductive layer in the slit structure can reduce the interconnect resistance. Further, by moving the step of forming the slit structure later in the fabrication processes, a thicker dielectric layer, such as silicon oxide, can be used to support the slit opening before it is filled, thereby avoiding the collapse.

Figure 2:
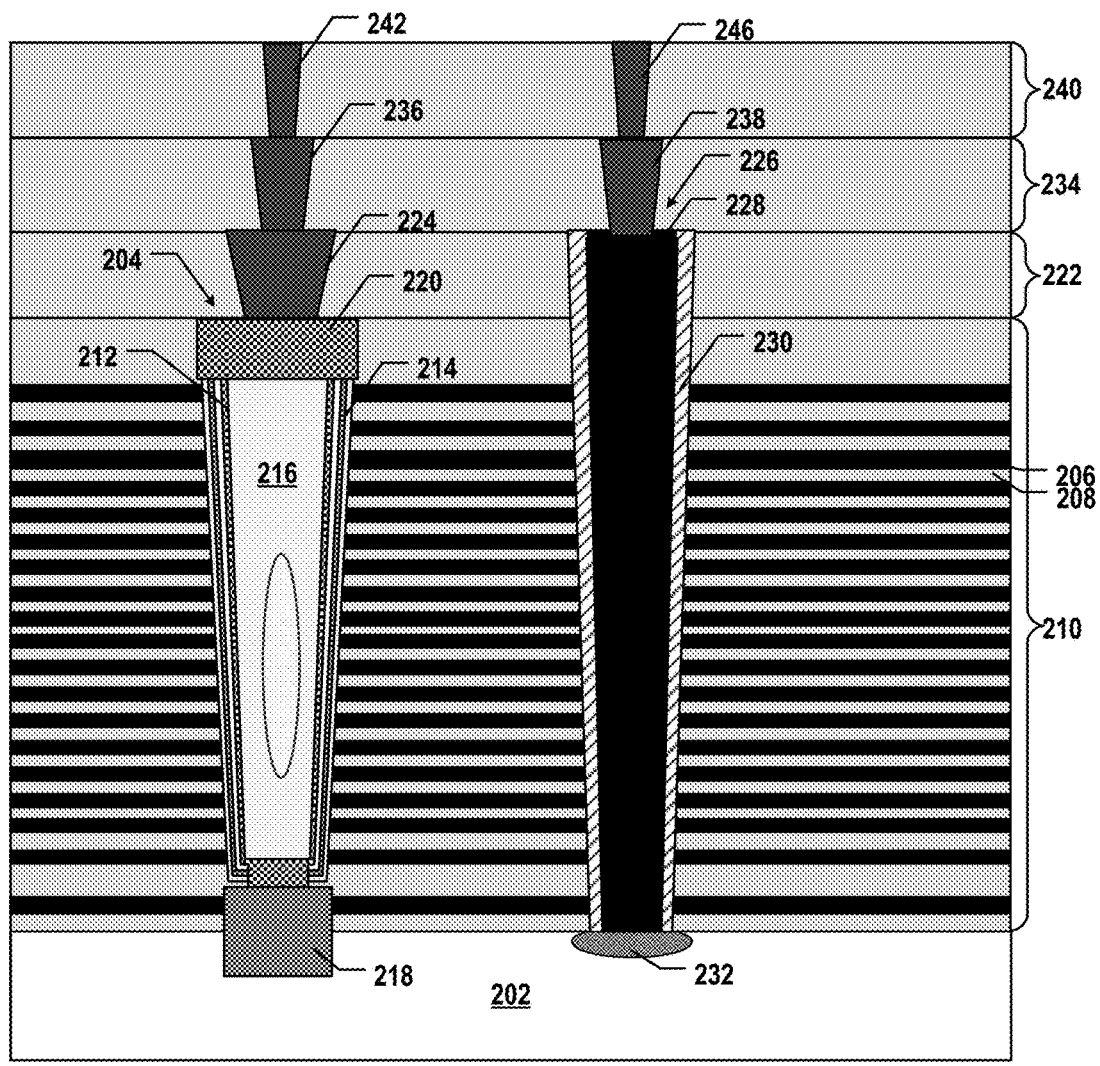
FIG. 2 illustrates a cross-section of an exemplary 3D memory device with an interconnect structure, according to some embodiments of the present disclosure.

FIG. 2 illustrates a cross-section of an exemplary 3D memory device 200 with an interconnect structure, according to some embodiments of the present disclosure. 3D memory device 200 can include a substrate 202, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 202 is a thinned substrate (e.g., a semiconductor layer), which was thinned by grinding, etching, chemical mechanical polishing (CMP), or any combination thereof.

3D memory device 200 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 200 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 202) remains as the substrate of the bonded non-monolithic 3D memory device, and the peripheral device (e.g., including any suitable digital, analog, and/or mixed-signal peripheral circuits used for facilitating the operation of 3D memory device 200, such as page buffers, decoders, and latches; not shown) is flipped and faces down toward the memory array device (e.g., NAND memory strings) for hybrid bonding. It is understood that in some embodiments, the memory array device substrate (e.g., substrate 202) is flipped and faces down toward the peripheral device (not shown) for hybrid bonding, so that in the bonded non-monolithic 3D memory device, the memory array device is above the peripheral device. The memory array device substrate (e.g., substrate 202) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 200 is a NAND Flash memory device in which memory cells are provided in the form of an array of NAND memory strings each extending vertically above substrate 202. The memory array device can include an array of channel structures 204 functioning as the array of NAND memory strings. As shown in FIG. 2, channel structure 204 can extend vertically through a plurality of pairs each including a conductive layer 206 and a dielectric layer 208. The interleaved conductive layers 206 and dielectric layers 208 are part of a memory stack 210. The number of the pairs of conductive layers 206 and dielectric layers 208 in memory stack 210 (e.g., 32, 64, 96, or 128) determines the number of memory cells in 3D memory device 200. It is understood that in some embodiments, memory stack 210 may have a multi-deck architecture (not shown), which includes a plurality of memory decks stacked over one another. The numbers of the pairs of conductive layers 206 and dielectric layers 208 in each memory deck can be the same or different.

Memory stack 210 can include a plurality of interleaved conductive layers 206 and dielectric layers 208. Conductive layers 206 and dielectric layers 208 in memory stack 210 can alternate in the vertical direction. In other words, except the ones at the top or bottom of memory stack 210, each conductive layer 206 can be adjoined by two dielectric layers 208 on both sides, and each dielectric layer 208 can be adjoined by two conductive layers 206 on both sides. Conductive layers 206 can include conductive materials including, but not limited to, tungsten (W), cobalt (Co), copper (Cu), aluminum (Al), polysilicon, doped silicon, silicides, or any combination thereof. Each conductive layer 206 can be a gate electrode (gate line) surrounding channel structure 204 and can extend laterally as a word line. Dielectric layers 208 can include dielectric materials including, but not limited to, silicon oxide, silicon nitride, silicon oxynitride, or any combination thereof.

As shown in FIG. 2, channel structure 204 can include a channel hole filled with a semiconductor layer (e.g., as a semiconductor channel 212) and a composite dielectric layer (e.g., as a memory film 214). In some embodiments, semiconductor channel 212 includes silicon, such as amorphous silicon, polysilicon, or single-crystal silicon. In some embodiments, memory film 214 is a composite layer including a tunneling layer, a storage layer (also known as a "charge trap layer"), and a blocking layer. The remaining space of channel structure 204 can be partially or fully filled with a capping layer 216 including dielectric materials, such as silicon oxide, and/or an air gap. Channel structure 204 can have a cylinder shape (e.g., a pillar shape). Capping layer 216, semiconductor channel 212, the tunneling layer, storage layer, and blocking layer of memory film 214 are arranged radially from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 214 can include a composite layer of silicon oxide/silicon oxynitride/silicon oxide (ONO).

In some embodiments, channel structure 204 further includes a semiconductor plug 218 in the lower portion (e.g., at the lower end) of channel structure 204. As used herein, the "upper end" of a component (e. g., channel structure 204) is the end farther away from substrate 202 in the y-direction, and the "lower end" of the component (e.g., channel structure 204) is the end closer to substrate 202 in the y-direction when substrate 202 is positioned in the lowest plane of 3D memory device 200. Semiconductor plug 218 can include a semiconductor material, such as silicon, which is epitaxially grown from substrate 202 in any suitable directions. It is understood that in some embodiments, semiconductor plug 218 includes single-crystal silicon, the same material of substrate 202. In other words, semiconductor plug 218 can include an epitaxially-grown semiconductor layer that is the same material as substrate 202. Semiconductor plug 218 can be below and in contact with the lower end of semiconductor channel 212. Semiconductor plug 218 can function as a channel controlled by a source select gate of the NAND memory string.

In some embodiments, channel structure 204 further includes a channel plug 220 in the upper portion (e.g., at the upper end) of channel structure 204. Channel plug 220 can be above and in contact with the upper end of semiconductor channel 212. Channel plug 220 can include semiconductor materials (e.g., polysilicon). In some embodiments, channel plug 220 includes an opening filled with a conductive layer, such as tungsten. By covering the upper end of channel structure 204 during the fabrication of 3D memory device 200, channel plug 220 can function as an etch stop layer to prevent etching of dielectrics filled in channel structure 204, such as silicon oxide and silicon nitride. In some embodiments, channel plug 220 can function as the drain of the NAND memory string.

As shown in FIG. 2, 3D memory device 200 also includes a local contact layer 222 on memory stack 210 as part of the interconnect structure. In some embodiments, local contact layer 222 is formed on top of the upper end of channel structure 204 (i.e., channel plug 220). Local contact layer 222 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. The interconnects in local contact layer 222 are referred to herein as "local contacts" (also known as "C1"), which are in contact with a structure in memory stack 210 directly. In some embodiments, local contact layer 222 includes a channel local contact 224 above and in contact with the upper end of channel structure 204 (e.g., channel plug 220).

Local contact layer 222 can further include one or more interlayer dielectric (ILD) layers (also known as "intermetal dielectric (IMD) layers") in which the local contacts (e.g., channel local contact 224) can form. In some embodiments, local contact layer 222 includes channel local contact 224 in one or more local dielectric layers. Channel local contact 224 in local contact layer 222 can include conductive materials including, but not limited to, Cu, Al, W, Co, silicides, or any combination thereof. In one example, channel local contact 224 is made of tungsten. The ILD layers in local contact layer 222 can include dielectric materials including, but not limited to, silicon oxide, silicon nitride, silicon oxynitride, low dielectric constant (low-k) dielectrics, or any combination thereof.

As shown in FIG. 2, 3D memory device 200 further includes a slit structure 226 extending vertically through local contact layer 222 and interleaved conductive layers 206 and dielectric layers 208 of memory stack 210. Slit structure 226 can also extend laterally to separate memory stack 210 into multiple blocks. Slit structure 226 can include a slit opening that provides access for the chemical precursor to form conductive layers 206. In some embodiments, slit structure 226 includes a source conductive layer 228 having conductive materials including, but not limited to, W, Co, Cu, Al, polysilicon, silicides, or any combination thereof. In some embodiments, source conductive layer 228 includes polysilicon in the lower portion of the slit opening and a metal (e.g., tungsten) in the upper portion of the slit opening. To electrically isolate source conductive layer 228 from conductive layers 206, slit structure 226 can further include a spacer 230 disposed along the sidewall of the slit opening and in etch-back recesses (not shown) abutting the sidewall of the slit opening. That is, spacer 230 can be formed between source conductive layer 228 and conductive layers 206 in memory stack 210. Spacer 230 can include one or more layers of dielectric materials, such as silicon oxide, silicon nitride, silicon oxynitride, or any combination thereof. In some embodiments, source conductive layer 228 of slit structure 226 works as the source contact of 3D memory device 200 and electrically connects to the source of the NAND memory string, e.g., an array common source (ACS) of the array of NAND memory strings. In some embodiments, slit structure 226 further includes a doped region 232 at its lower end in substrate 202 to reduce the resistance of the electrical connection with the ACS.

Different from slit structure 108 of 3D memory device 100 in FIG. 1, which has its upper end flush with the upper end of channel structure 106 below local contact layer 110, slit structure 226 of 3D memory device 200 in FIG. 2 has its upper end above the upper end of channel structure 204. That is, slit structure 226 can extend vertically further through local contact layer 222. As a result, local contact layer 222 does not include a slit local contact above and in contact with the upper end of slit structure 226, which is different from local contact layer 110 in FIG. 1 that includes slit local contact 118 of slit structure 108. As shown in FIG. 2, the upper end of slit structure 226 is flush with the upper end of channel local contact 224, according to some embodiments. By replacing the slit local contact with a continues, trench-like interconnect (e.g., source conductive layer 228 of slit structure 226), the overlay control for the local contacts in local contact layer 222 can be simplified, and the resistance of the interconnect structure can be reduced.

As shown in FIG. 2, 3D memory device 200 also includes a first interconnect layer 234 on local contact layer 222 as part of the interconnect structure. First interconnect layer 234 can include a plurality of via contacts (also known as "V0"), such as a channel contact 236 above and in contact with the upper end of channel local contact 224 and a slit contact 238 above and in contact with the upper end of slit structure 226. First interconnect layer 234 can further include one or more ILD layers in which channel contact 236 and slit contact 238 can form. That is, first interconnect layer 234 can include channel contact 236 and slit contact 238 in one or more first dielectric layers. Channel contact 236 and slit contact 238 in first interconnect layer 234 can include conductive materials including, but not limited to, Cu, Al, W, Co, silicides, or any combination thereof. In one example, channel contact 236 and slit contact 238 each is made of tungsten. The ILD layers in first interconnect layer 234 can include dielectric materials including, but not limited to, silicon oxide, silicon nitride, silicon oxynitride, low-k dielectrics, or any combination thereof.

As shown in FIG. 2, 3D memory device 200 further includes a second interconnect layer 240 on first interconnect layer 222 as part of the interconnect structure. Second interconnect layer 240 can include a plurality of interconnect lines (also known as "M1"), such as a bit line 242 above and in contact with the upper end of channel contact 236 and a source line 246 above and in contact with the upper end of slit contact 238. Each bit line 242 can be used to individually address corresponding channel structure 204 electrically connected to bit line 242 through channel local contact 224 and channel contact 236. Each source line 246 can be used to apply a common source voltage (e.g., ground) to the corresponding ACS electrically connected to source line 246 through source conductive layer 228 of slit structure 226 and slit contact 238.

Second interconnect layer 240 can further include one or more ILD layers in which bit line 242 and source line 246 can form. That is, second interconnect layer 240 can include bit line 242 and source line 246 in one or more second dielectric layers. Bit line 242 and source line 246 in second interconnect layer 240 can include conductive materials including, but not limited to, Cu, Al, W, Co, silicides, or any combination thereof. In one example, bit line 242 and source line 246 each is made of copper. The ILD layers in second interconnect layer 240 can include dielectric materials including, but not limited to, silicon oxide, silicon nitride, silicon oxynitride, low-k dielectrics, or any combination thereof.

It is to be understood that the number of interconnect layers in 3D memory device 200 is not limited by the example in FIG. 2. Additional interconnect layer(s) with contacts can be formed to provide desired interconnect structures of 3D memory device 200. Nevertheless, local contact layer 222, first interconnect layer 234, and second interconnect layer 240 form interconnect structures for transferring electrical signals from and to channel structure 204 and slit structure 226. In some embodiments, the interconnect structure of channel structure 204 includes channel local contact 224, channel contact 236, and bit line 242, and the interconnect structure of slit structure 226 includes slit contact 238 and source line 246 without a slit local contact in local contact layer 222.

Figure 3:
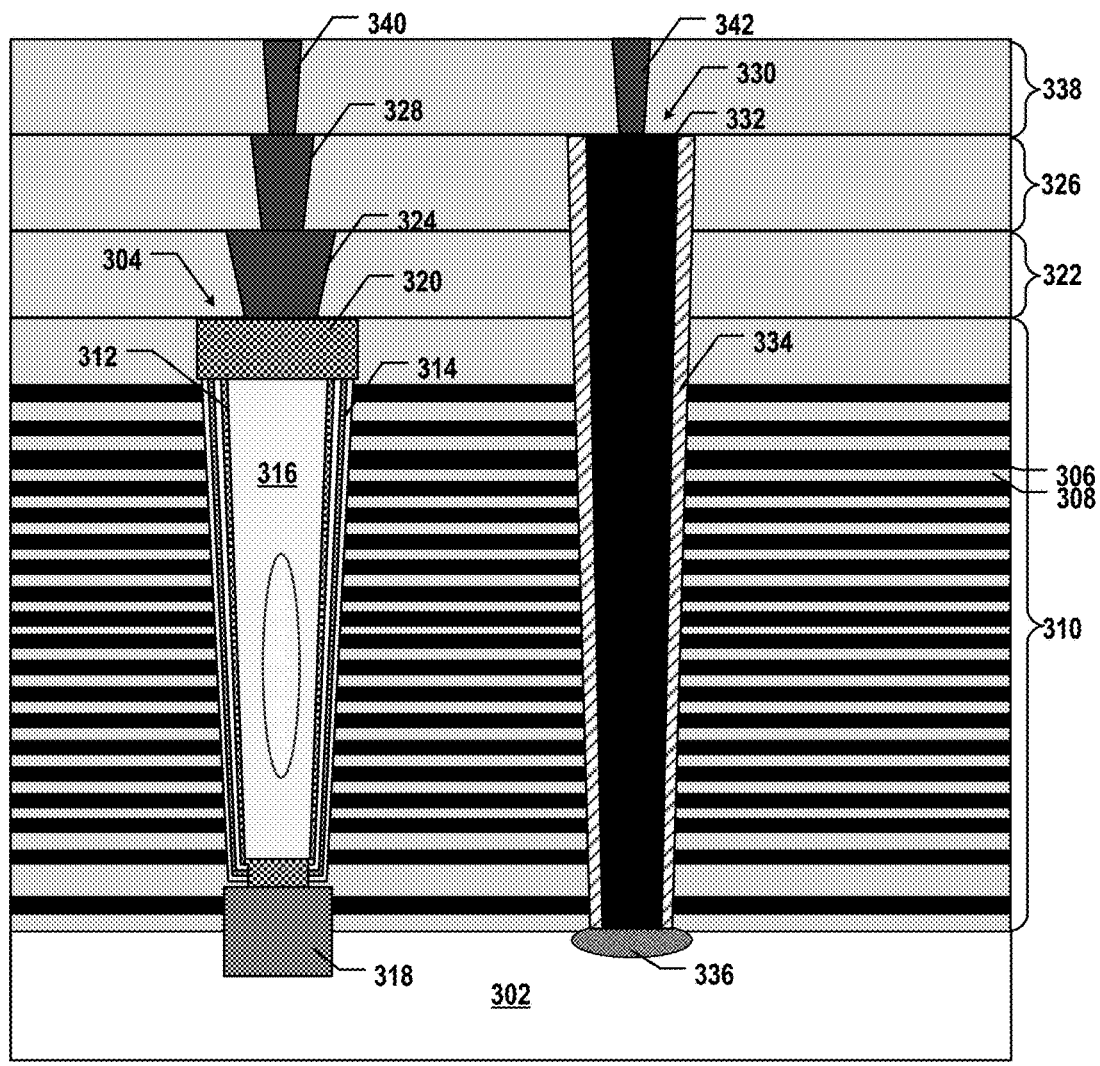
FIG. 3 illustrates a cross-section of another exemplary 3D memory device with an interconnect structure, according to some embodiments of the present disclosure.

FIG. 3 illustrates a cross-section of another exemplary 3D memory device 300 with an interconnect structure, according to some embodiments of the present disclosure. Similar to 3D memory device 200 described above in FIG. 2, 3D memory device 300 represents an example of a 3D memory device having a channel structure 304, a slit structure 330, and interconnect structures for channel structure 304 and slit structure 330. Different from 3D memory device 200 described above in FIG. 2 in which slit structure 226 extends vertically through local contact layer 222 and memory stack 210, slit structure 330 of 3D memory device 300 in FIG. 3 extends vertically further through a first interconnect layer 326. As a result, a slit contact (e.g., slit contact 238 in FIG. 2) is not needed in 3D memory device 300. It is understood that the details of similar structures (e.g., materials, fabrication process, functions, etc.) in both 3D memory devices 200 and 300 may not be repeated below.

As shown in FIG. 3, 3D memory device 300 can include a memory stack 310 including interleaved conductive layers 306 and dielectric layers 308 above a substrate 302. In some embodiments, channel structure 304 extends vertically through memory stack 310 above substrate 302. Channel structure 304 can include a semiconductor channel 312, a memory film 314, and a capping layer 316. In some embodiments, memory film 314 is a composite dielectric layer including a tunneling layer, a storage layer (also known as a "charge trap layer"), and a blocking layer. Channel structure 304 can have a cylinder shape (e.g., a pillar shape). Capping layer 316, semiconductor channel 312, the tunneling layer, storage layer, and blocking layer of memory film 314 are arranged radially from the center toward the outer surface of the pillar in this order, according to some embodiments. In some embodiments, channel structure 304 further includes a semiconductor plug 318 in the lower portion (e.g., at the lower end) of channel structure 304. In some embodiments, channel structure 304 further includes a channel plug 320 in the upper portion (e.g., at the upper end) of channel structure 304. Channel plug 320 can be above and in contact with the upper end of semiconductor channel 312.

As shown in FIG. 3, 3D memory device 300 also includes a local contact layer 322 on memory stack 310 as part of the interconnect structure. In some embodiments, local contact layer 322 is formed on top of the upper end of channel structure 304 (i.e., channel plug 320). Local contact layer 322 can include a channel local contact 324 above and in contact with the upper end of channel structure 304 (e.g., channel plug 320). Local contact layer 322 can further include one or more ILD layers in which the local contacts (e.g., channel local contact 324) can form. In some embodiments, local contact layer 322 includes channel local contact 324 in one or more local dielectric layers. As shown in FIG. 3, 3D memory device 300 also includes a first interconnect layer 326 on local contact layer 322 as part of the interconnect structure. First interconnect layer 326 can include a plurality of via contacts, such as a channel contact 328 above and in contact with the upper end of channel local contact 324. First interconnect layer 326 can further include one or more ILD layers in which channel contact 328 can form. That is, first interconnect layer 326 can include channel contact 328 in one or more first dielectric layers. Channel local contact 324 in local contact layer 322 and channel contact 328 in first interconnect layer 326 can include conductive materials including, but not limited to, Cu, Al, W, Co, silicides, or any combination thereof. In one example, channel local contact 324 and channel contact 328 each is made of tungsten. The ILD layers in local contact layer 322 and first interconnect layer 326 can include dielectric materials including, but not limited to, silicon oxide, silicon nitride, silicon oxynitride, low-k dielectrics, or any combination thereof.

As shown in FIG. 3, 3D memory device 300 further includes slit structure 330 extending vertically through first interconnect layer 326, local contact layer 322 and interleaved conductive layers 306 and dielectric layers 308 of memory stack 310. Slit structure 330 can also extend laterally to separate memory stack 310 into multiple blocks. Slit structure 330 can include a slit opening that provides access for the chemical precursor to form conductive layers 306. In some embodiments, slit structure 330 includes a source conductive layer 332 having conductive materials including, but not limited to, W, Co, Cu, Al, polysilicon, silicides, or any combination thereof. In some embodiments, source conductive layer 332 includes polysilicon in the lower portion of the slit opening and a metal (e.g., tungsten) in the upper portion of the slit opening. To electrically isolate source conductive layer 332 from conductive layers 306, slit structure 330 can further include a spacer 334 disposed along the sidewall of the slit opening and in etch-back recesses (not shown) abutting the sidewall of the slit opening. That is, spacer 334 can be formed between source conductive layer 332 and conductive layers 306 in memory stack 310. Spacer 334 can include one or more layers of dielectric materials, such as silicon oxide, silicon nitride, silicon oxynitride, or any combination thereof. In some embodiments, source conductive layer 332 of slit structure 330 works as the source contact of 3D memory device 300 and electrically connects to the source of the NAND memory string, e.g., an ACS of the array of NAND memory strings. In some embodiments, slit structure 330 further includes a doped region 336 at its lower end in substrate 302 to reduce the resistance of the electrical connection with the ACS.

Different from slit structure 108 of 3D memory device 100 in FIG. 1, which has its upper end flush with the upper end of channel structure 106 below local contact layer 110, slit structure 330 of 3D memory device 300 in FIG. 3 has its upper end above the upper end of channel structure 304. That is, slit structure 330 can extend vertically further through local contact layer 322 and first interconnect layer 326. As a result, local contact layer 322 does not include a slit local contact, and first interconnect layer 326 does not include a slit contact, which is different from local contact layer 110 and first interconnect layer 112 in FIG. 1 that include slit local contact 118 and slit contact 122 of slit structure 108, respectively. As shown in FIG. 3, the upper end of slit structure 330 is flush with the upper end of channel contact 328, according to some embodiments. By replacing the slit local contact and the slit contact with a continues, trench-like interconnect (e.g., source conductive layer 332 of slit structure 330), the overlay control for the local contacts in local contact layer 322 and the via contacts in first interconnect layer 326 can be simplified, and the resistance of the interconnect structure can be reduced.

As shown in FIG. 3, 3D memory device 300 further includes a second interconnect layer 338 on first interconnect layer 326 as part of the interconnect structure. Second interconnect layer 338 can include a plurality of interconnect lines, such as a bit line 340 above and in contact with the upper end of channel contact 328 and a source line 342 above and in contact with the upper end of slit structure 330. Each bit line 340 can be used to individually address corresponding channel structure 304 electrically connected to bit line 340 through channel local contact 324 and channel contact 328. Each source line 342 can be used to apply a common source voltage (e.g., ground) to the corresponding ACS electrically connected to source line 342 through source conductive layer 332 of slit structure 330. Second interconnect layer 338 can further include one or more ILD layers in which bit line 340 and source line 342 can form. That is, second interconnect layer 338 can include bit line 340 and source line 342 in one or more second dielectric layers. Bit line 340 and source line 342 in second interconnect layer 338 can include conductive materials including, but not limited to, Cu, Al, W, Co, silicides, or any combination thereof. In one example, bit line 340 and source line 342 each is made of copper. The ILD layers in second interconnect layer 338 can include dielectric materials including, but not limited to, silicon oxide, silicon nitride, silicon oxynitride, low-k dielectrics, or any combination thereof.

It is to be understood that the number of interconnect layers in 3D memory device 300 is not limited by the example in FIG. 3. Additional interconnect layer(s) with contacts can be formed to provide desired interconnect structures of 3D memory device 300. Nevertheless, local contact layer 322, first interconnect layer 326, and second interconnect layer 338 form interconnect structures for transferring electrical signals from and to channel structure 304 and slit structure 330. In some embodiments, the interconnect structure of channel structure 304 includes channel local contact 324, channel contact 328, and bit line 340, and the interconnect structure of slit structure 330 includes source line 342 without a slit local contact in local contact layer 322 and a slit contact in first interconnect layer 326.

Figure 6:
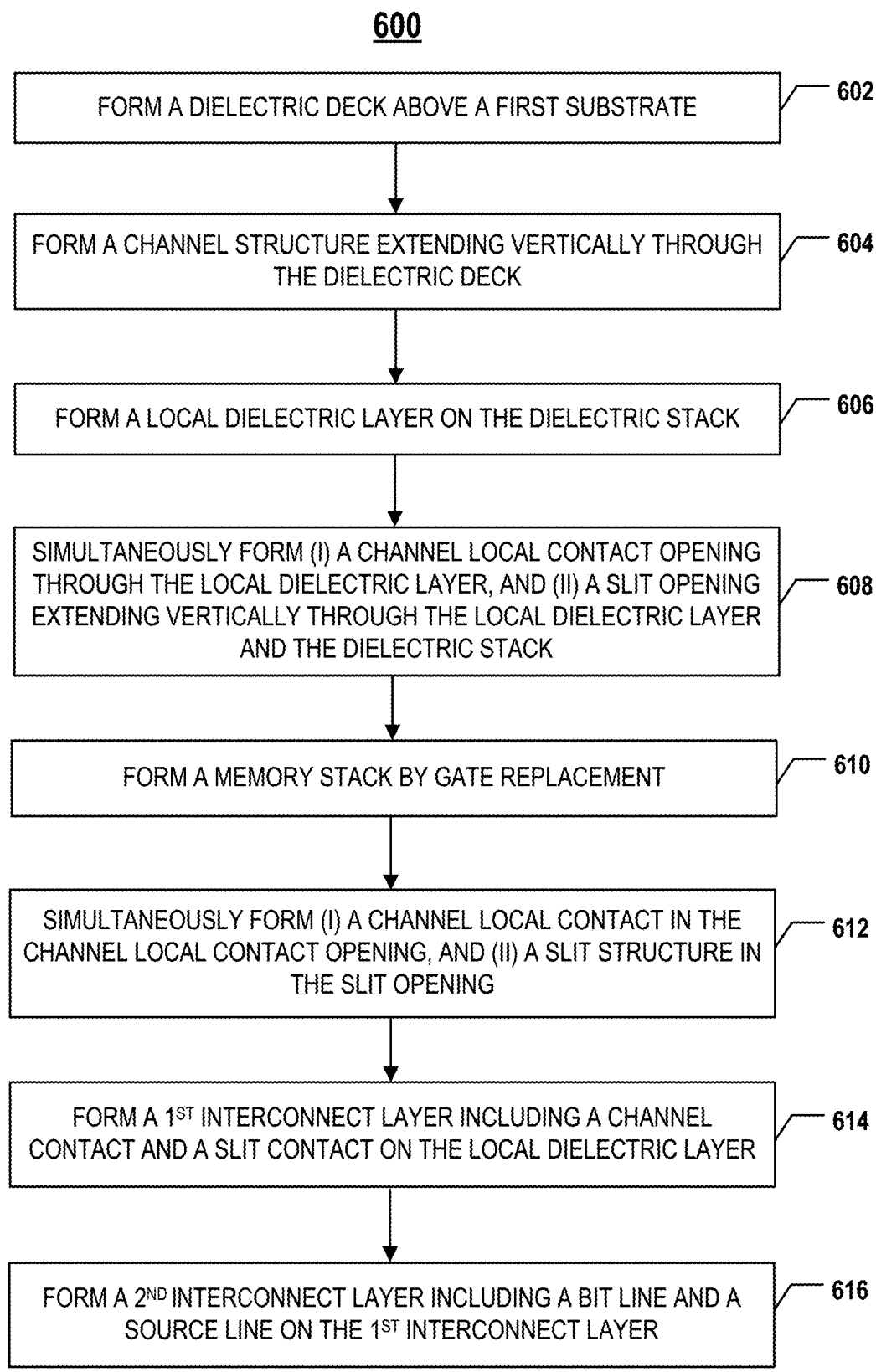
FIG. 6 illustrates a flowchart of a method for forming an exemplary 3D memory device with an interconnect structure, according to some embodiments of the present disclosure.

FIGS. 4A-4G illustrate a fabrication process for forming an exemplary 3D memory device with an interconnect structure, according to some embodiments of the present disclosure. FIG. 6 illustrates a flowchart of a method 600 for forming an exemplary 3D memory device with an interconnect structure, according to some embodiments of the present disclosure. Examples of the 3D memory device depicted in FIGS. 4A-4G and 6 include 3D memory device 200 depicted in FIG. 2. FIGS. 4A-4G and 6 will be described together. It is understood that the operations shown in method 600 are not exhaustive and that other operations can be performed as well before, after, or between any of the illustrated operations. Further, some of the operations may be performed simultaneously, or in a different order than shown in FIG. 6.

Figure 4A:
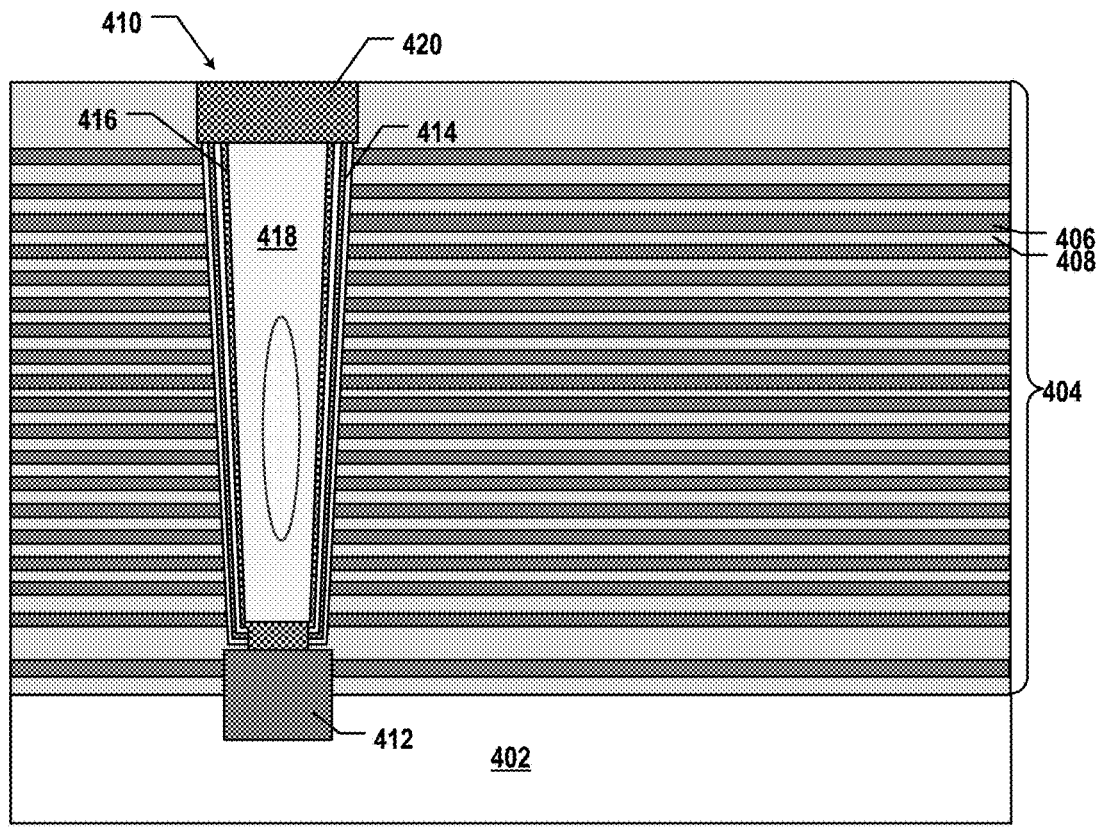
FIGS. 4A-4G illustrate a fabrication process for forming an exemplary 3D memory device with an interconnect structure, according to some embodiments of the present disclosure.
Figure 4A:

Referring to FIG. 6, method 600 starts at operation 602, in which a dielectric stack including interleaved sacrificial layers and dielectric layers above a substrate. The substrate can be a silicon substrate. Referring to FIG. 4A, a dielectric stack 404 including a plurality pairs of a sacrificial layer 406 and a dielectric layer 408 is formed above a silicon substrate 402. Dielectric stack 404 includes interleaved sacrificial layers 406 and dielectric layers 408, according to some embodiments. Dielectric layers 408 and sacrificial layers 406 can be alternatingly deposited on silicon substrate 402 to form dielectric stack 404. In some embodiments, each dielectric layer 408 includes a layer of silicon oxide, and each sacrificial layer 406 includes a layer of silicon nitride. That is, a plurality of silicon nitride layers and a plurality of silicon oxide layers can be alternatingly deposited above silicon substrate 402 to form dielectric stack 404. Dielectric stack 404 can be formed by one or more thin film deposition processes including, but not limited to, chemical vapor deposition (CVD), physical vapor deposition (PVD), atomic layer deposition (ALD), or any combination thereof.

Method 600 proceeds to operation 604, as illustrated in FIG. 6, in which a channel structure extending vertically through the dielectric stack is formed. In some embodiments, to form the channel structure, a channel hole extending vertically through the dielectric stack is formed, a memory film and a semiconductor channel are subsequently deposited over a sidewall of the channel hole, and a plug is formed above and in contact with the memory film and the semiconductor channel.

As illustrated in FIG. 4A, a channel hole is an opening extending vertically through dielectric stack 404. In some embodiments, a plurality of openings are formed through dielectric stack 404 such that each opening becomes the location for growing an individual channel structure 410 in the later process. In some embodiments, fabrication processes for forming the channel hole of channel structure 410 include wet etching and/or dry etching, such as deep-ion reactive etching (DRIE). In some embodiments, the channel hole of channel structure 410 extends further through the top portion of silicon substrate 402. The etching process through dielectric stack 404 may not stop at the top surface of silicon substrate 402 and may continue to etch part of silicon substrate 402. As illustrated in FIG. 4A, a semiconductor plug 412 can be formed by filling the lower portion of the channel hole with single-crystal silicon epitaxially grown from silicon substrate 402 in any suitable directions (e.g., from the bottom surface and/or side surface). The fabrication processes for epitaxially growing semiconductor plug 412 can include, but not limited to, vapor-phase epitaxy (VPE), liquid-phase epitaxy (LPE), molecular-beam epitaxy (MPE), or any combinations thereof.

As illustrated in FIG. 4A, a memory film 414 (including a blocking layer, a storage layer, and a tunneling layer) and a semiconductor channel 416 are formed along the sidewall of the channel hole of channel structure 410 and above semiconductor plug 412. In some embodiments, memory film 414 is first deposited along the sidewall of the channel hole and above semiconductor plug 412, and semiconductor channel 416 is then deposited over memory film 414. The blocking layer, storage layer, and tunneling layer can be subsequently deposited in this order using one or more thin film deposition processes, such as ALD, CVD, PVD, any other suitable processes, or any combination thereof, to form memory film 414. Semiconductor channel 416 can then be formed by depositing polysilicon on the tunneling layer using one or more thin film deposition processes, such as ALD, CVD, PVD, any other suitable processes, or any combination thereof. Semiconductor channel 416 can be in contact with semiconductor plug 412 using, for example, a SONO punch process. In some embodiments, semiconductor channel 416 is deposited in the channel hole without completely filling the channel hole. As illustrated in FIG. 4A, a capping layer 418, such as a silicon oxide layer, is formed in the channel hole to fully or partially fill the remaining space of the channel hole using one or more thin film deposition processes, such as CVD, PVD, ALD, electroplating, electroless plating, or any combination thereof.

As illustrated in FIG. 4A, a channel plug 420 is formed in the upper portion of the channel hole of channel structure 410. In some embodiments, parts of memory film 414, semiconductor channel 416, and capping layer 418 that are on the top surface of dielectric stack 404 are removed and planarized by CMP, wet etching and/or dry etching. A recess then can be formed in the upper portion of the channel hole by wet etching and/or drying etching parts of memory film 414, semiconductor channel 416, and capping layer 418 in the upper portion of the channel hole. Channel plug 420 then can be formed by depositing semiconductor materials, such as polysilicon, and/or metals, such as tungsten, into the recess by one or more thin film deposition processes, such as CVD, PVD, ALD, electroplating, electroless plating, or any combination thereof. Channel structure 410 is thereby formed through dielectric stack 404.

Figure 4B:
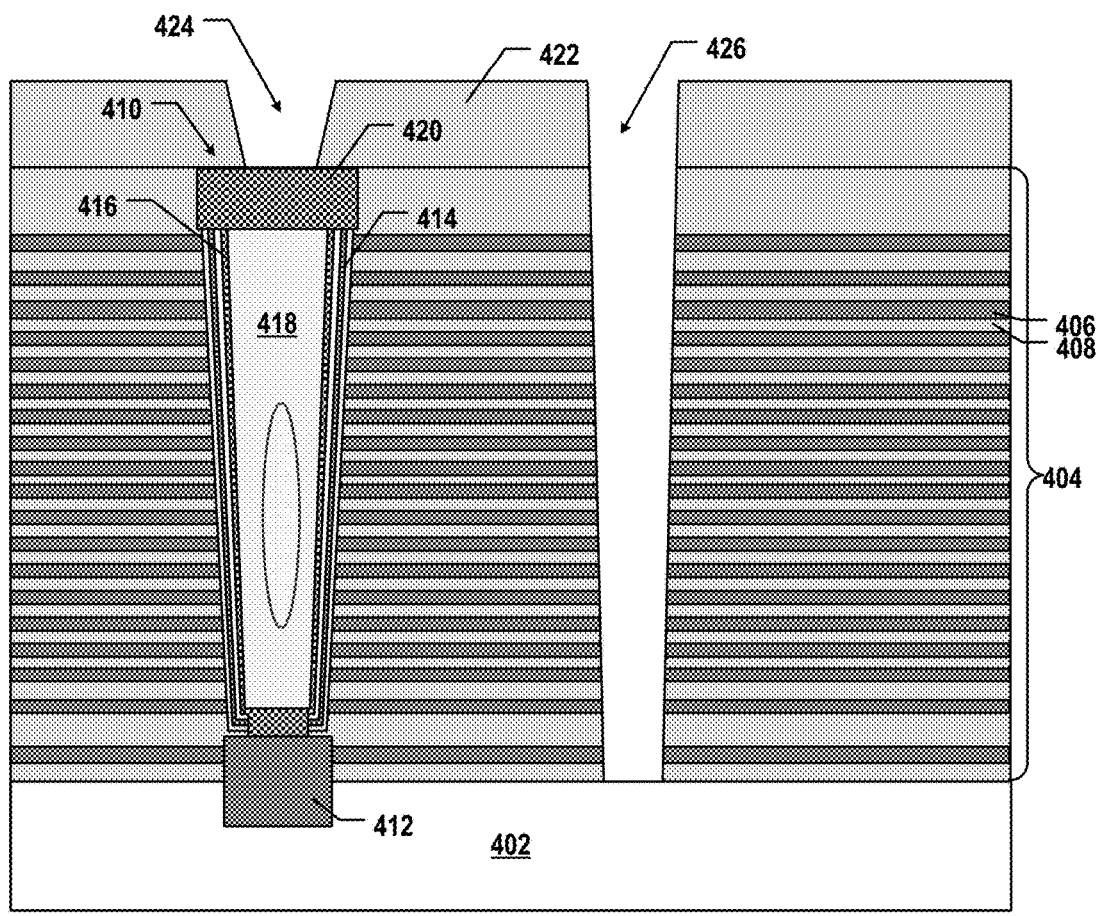
Figure 4B:
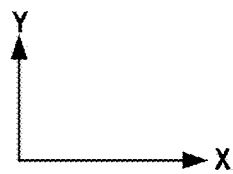

Method 600 proceeds to operation 606, as illustrated in FIG. 6, in which a local dielectric layer is formed on the dielectric stack. The local dielectric layer is part of the interconnect structure of the 3D memory device to be formed. Different from existing methods for forming 3D memory devices (e.g., 3D memory device 100 in FIG. 1) with an interconnect structure in which the formation of the interconnect structure (including the local dielectric layer) starts after the formation of the slit structure, method 600 forms the local contact layer (including the local dielectric layer) prior to the formation of the slit structure. As illustrated in FIG. 4B, a local dielectric layer 422 is formed on dielectric stack 404. Local dielectric layer 422 can be formed by depositing dielectric materials, such as silicon oxide and/or silicon nitride, using one or more thin film deposition processes, such as CVD, PVD, ALD, or any combination thereof, on top of the top surface of dielectric stack 404.

Method 600 proceeds to operation 608, as illustrated in FIG. 6, in which a channel local contact opening through the local dielectric layer to expose an upper end of the channel structure, and a slit opening extending vertically through the local dielectric layer and the dielectric stack are simultaneously formed. As illustrated in FIG. 4B, a channel local contact opening 424 and a slit opening 426 are simultaneously formed using the same etching process. In some embodiments, the same etching process etches channel local contact opening 424 through local dielectric layer 422 stopping at the upper end of channel plug 420 of channel structure 410 to expose the upper end of channel plug 420, and also etches slit opening 426 through local dielectric layer 422 as well as interleaved sacrificial layers 406 and dielectric layers 408 (e.g., silicon nitride layers and silicon oxide layers) of dielectric stack 404 to reach silicon substrate 402. The etching process can include one or more cycles of wet etching and/or dry etching (e.g., DRIE). Channel local contact opening 424 and slit opening 426 can be patterned by an etching mask (e.g., photoresist) using photolithography, such that channel local contact opening 424 is aligned with channel structure 410 and slit opening 426 is to be formed at the place where a slit structure is to be formed.

Figure 4C:
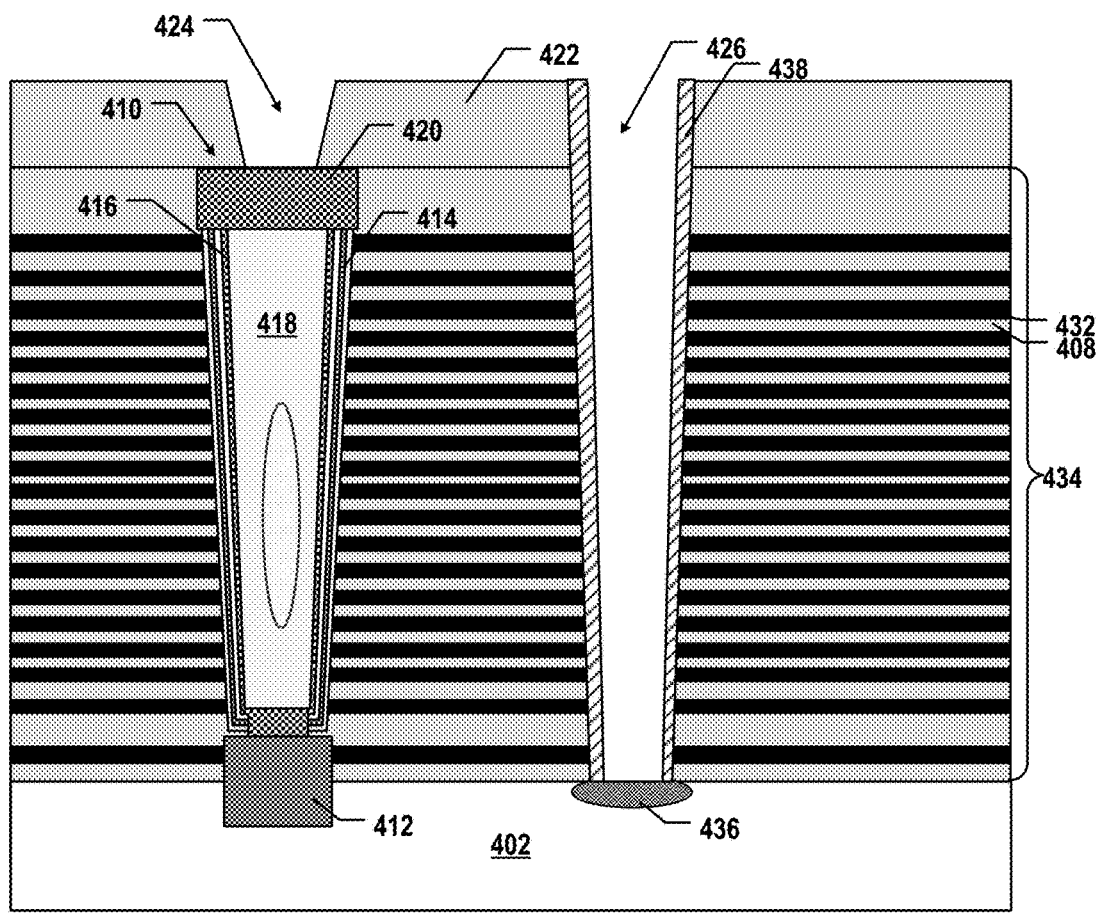

Method 600 proceeds to operation 610, as illustrated in FIG. 6, in which a memory stack including interleaved conductive layers and the dielectric layers is formed by replacing, through the slit opening, the sacrificial layers with the conductive layers (i.e., the so-called "gate replacement" process). As illustrated in FIG. 4C, sacrificial layers 406 (shown in FIG. 4B) are replaced with conductive layers 432, and a memory stack 434 including interleaved conductive layers 432 and dielectric layers 408 is thereby formed.

In some embodiments, lateral recesses (not shown) are first formed by removing sacrificial layers 406 through slit opening 426. In some embodiments, sacrificial layers 406 are removed by applying etching solutions through slit opening 426, such that sacrificial layers 406 are removed, creating the lateral recesses interleaved between dielectric layers 408. The etching solutions can include any suitable etchants that etch sacrificial layers 406 selective to dielectric layers 408. As illustrated in FIG. 4C, conductive layers 432 are deposited into the lateral recesses through slit opening 426. In some embodiments, gate dielectric layers (not shown) are deposited into the lateral recesses prior to conductive layers 432, such that conductive layers 432 are deposited on the gate dielectric layers. Conductive layers 432, such as metal layers, can be deposited using one or more thin film deposition processes, such as ALD, CVD, PVD, any other suitable processes, or any combination thereof.

Method 600 proceeds to operation 612, as illustrated in FIG. 6, in which a channel local contact in the channel local contact opening, and a slit structure in the slit opening are simultaneously formed. In some embodiments, to simultaneously form the channel local contact and the slit structure, a conductive layer is simultaneously deposited in the channel local contact opening and the slit opening. The conductive layer can include tungsten.

As illustrated in FIG. 4C, prior to the deposition of the conductive layer, a doped region 436 can be formed at the lower end of slit opening 426 (in silicon substrate 402) and a spacer 438 can be formed over the sidewall of slit opening 426. Doped region 436 can be formed by ion implantation and/or thermal diffusion to dope P-type or N-type dopants into part of silicon substrate 402 exposed through slit opening 426. In some embodiments, etch-back recesses (not shown) are formed in each conductive layer 432 abutting the sidewall of slit opening 426. Etch-back recesses can be etched-back using wet etching and/or dry etching processes through slit opening 426. Spacer 438 including one or more dielectric layers, such as silicon oxide and silicon nitride, is deposited into the etch-back recesses and along the sidewall of slit opening 426 using one or more thin film deposition processes, such as ALD, CVD, PVD, any other suitable processes, or any combination thereof, according to some embodiments.

Figure 4D:
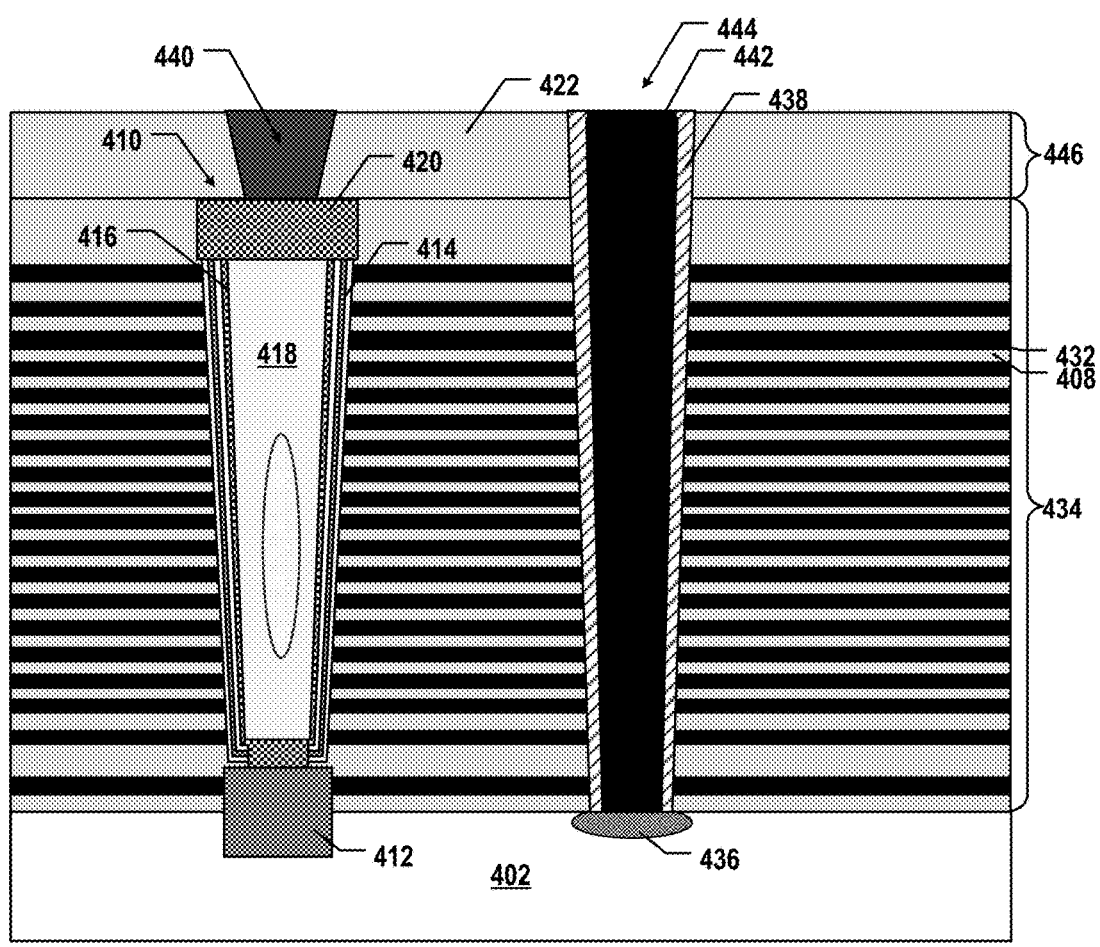

As illustrated in FIG. 4D, a conductive layer including, for example, tungsten, is deposited by the same deposition process into channel local contact opening 424 (shown in FIG. 4C) and the remaining space of slit opening 426 (shown in FIG. 4C) to simultaneously form a channel local contact 440 and a source conductive layer 442. A local contact layer 446 including local dielectric layer 422 and channel local contact 440 is thereby formed. A CMP process can be performed to remove the excess conductive layer and planarize the top surface of local contact layer 446. A slit structure 444 including source conductive layer 442, spacer 438, and doped region 436 is thereby simultaneously formed with channel local contact 440. The deposition process can include thin film deposition processes, such as ALD, CVD, PVD, any other suitable processes, or any combination thereof. In some embodiments, a polysilicon layer is deposited into slit opening 426 first prior to the simultaneous deposition of the conductive layer (e.g., tungsten) into channel local contact opening 424 and slit opening 426. Slit structure 444 extends through local contact layer 446 as well, according to some embodiments as shown in FIG. 4D.

Method 600 proceeds to operation 614, as illustrated in FIG. 6, in which a first interconnect layer is formed on the local dielectric layer. The first interconnect layer includes a channel contact above and in contact with an upper end of the channel local contact, and a slit contact above and in contact with an upper end of the slit structure. In some embodiments, to form the first interconnect layer, a first dielectric layer is formed on the local dielectric layer. In some embodiments, to form the first interconnect layer, a channel contact opening through the first dielectric layer to expose the upper end of the channel local contact, and a slit contact opening through the first dielectric layer to expose the upper end of the slit structure are simultaneously formed. In some embodiments, to form the first interconnect layer, a conductive layer is simultaneously deposited in the channel contact opening and the slit contact opening.

Figure 4E:
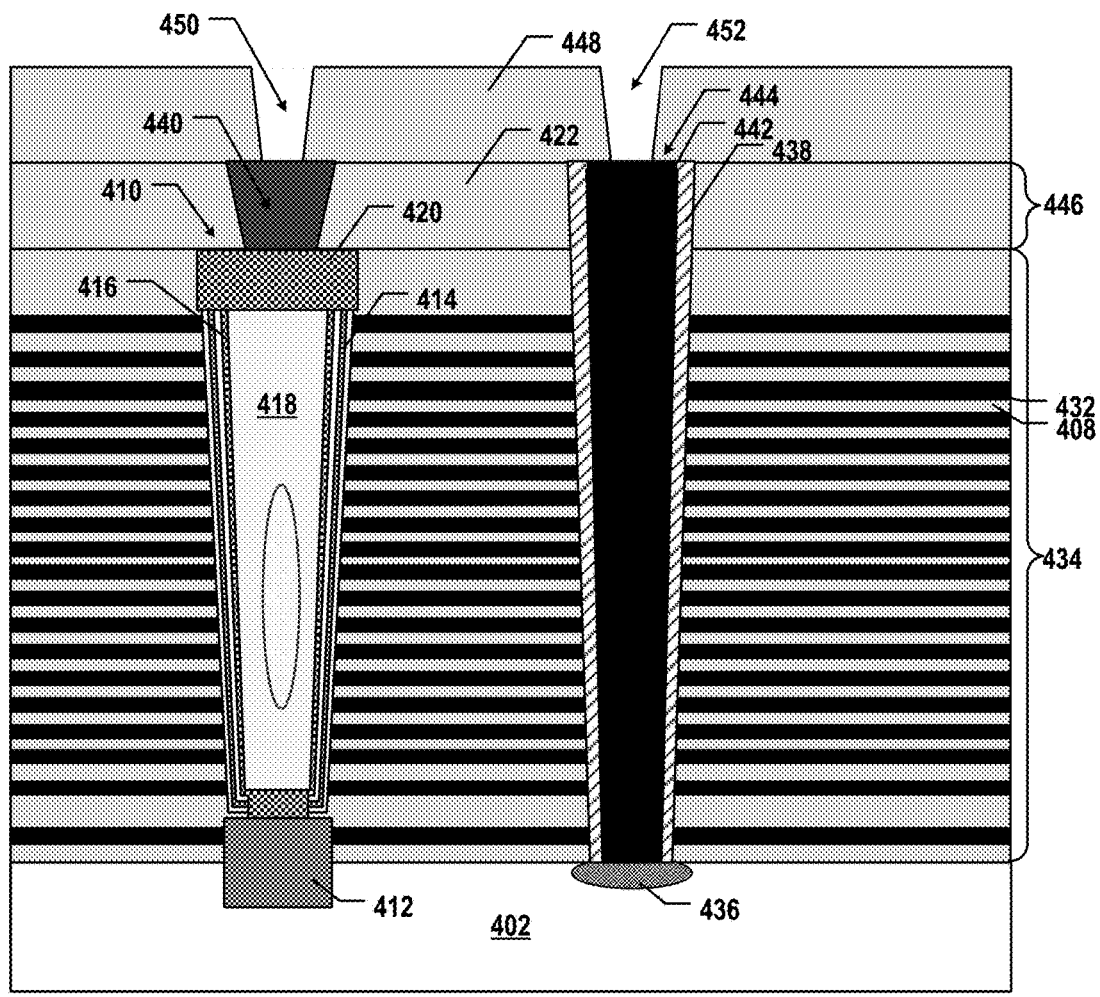

As illustrated in FIG. 4E, a first dielectric layer 448 is formed on local dielectric layer 422 of local contact layer 446. First dielectric layer 448 can be formed by depositing dielectric materials, such as silicon oxide and/or silicon nitride, using one or more thin film deposition processes, such as CVD, PVD, ALD, or any combination thereof, on top of the top surface of local dielectric layer 422 of local contact layer 446. As illustrated in FIG. 4E, a channel contact opening 450 and a slit contact opening 452 are simultaneously formed through first dielectric layer 448 using the same etching process. In some embodiments, the same etching process etches channel contact opening 450 through first dielectric layer 448 stopping at the upper end of channel local contact 440 to expose the upper end of channel local contact 440, and also etches slit contact opening 452 through first dielectric layer 448 stopping at the upper end of slit structure 444 to expose the upper end of slit structure 444. The etching process can include one or more cycles of wet etching and/or dry etching. Channel contact opening 450 and slit contact opening 452 can be patterned by an etching mask (e.g., photoresist) using photolithography, such that channel contact opening 450 is aligned with channel local contact 440 and slit contact opening 452 is aligned with slit structure 444.

Figure 4F:
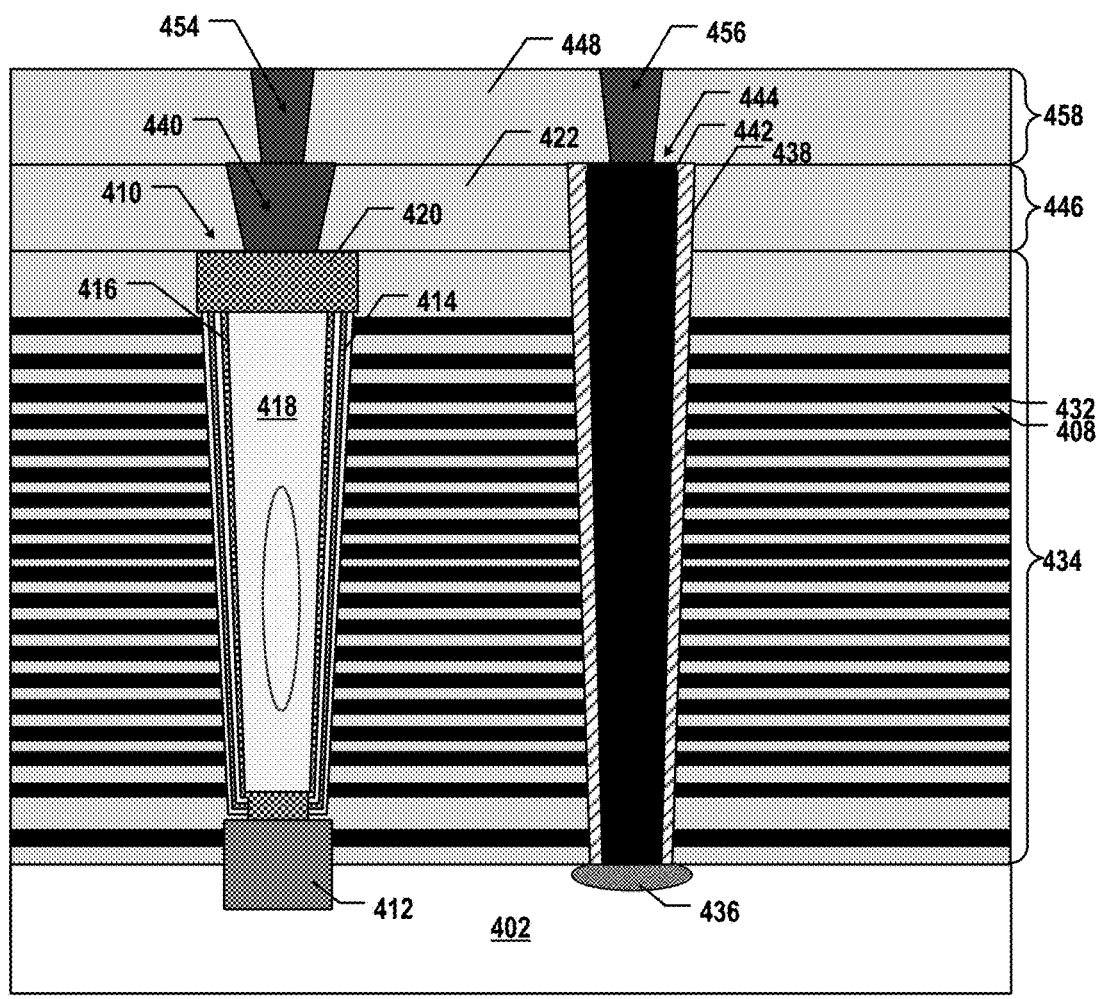

As illustrated in FIG. 4F, a conductive layer including, for example, tungsten, is deposited by the same deposition process into channel contact opening 450 (shown in FIG. 4E) and slit contact opening 452 (shown in FIG. 4E) to simultaneously form a channel contact 454 and a slit contact 456. A first interconnect layer 458 including first dielectric layer 448, channel contact 454, and slit contact 456 is thereby formed. A CMP process can be performed to remove the excess conductive layer and planarize the top surface of first interconnect layer 458. The deposition process can include thin film deposition processes, such as ALD, CVD, PVD, any other suitable processes, or any combination thereof.

Figure 4G:
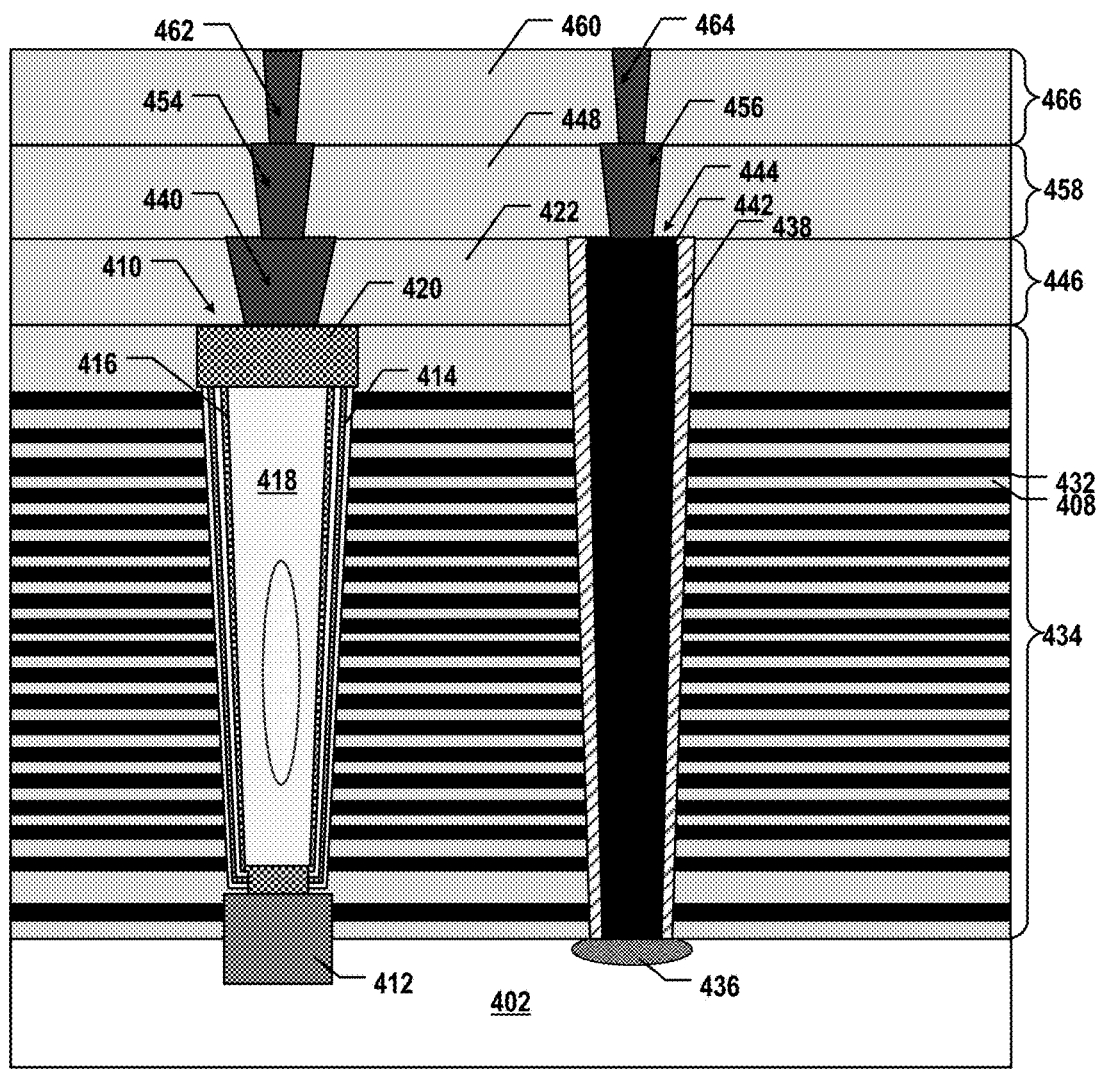

Method 600 proceeds to operation 616, as illustrated in FIG. 6, in which a second interconnect layer is formed on the first interconnect layer. The second interconnect layer includes a bit line above and in contact with an upper end of the channel contact, and a source line above and in contact with an upper end of the slit contact. As illustrated in FIG. 4G, a second dielectric layer 460 is formed on first dielectric layer 448 of first interconnect layer 458. Second dielectric layer 460 can be formed by depositing dielectric materials, such as silicon oxide and/or silicon nitride, using one or more thin film deposition processes, such as CVD, PVD, ALD, or any combination thereof, on top of the top surface of first dielectric layer 448 of first interconnect layer 458. In some embodiments, a bit line opening and a source line opening are simultaneously formed through second dielectric layer 460 using the same etching process. In some embodiments, the same etching process etches the bit line opening through second dielectric layer 460 stopping at the upper end of channel contact 454 to expose the upper end of channel contact 454, and also etches the source line opening through second dielectric layer 460 stopping at the upper end of slit contact 456 to expose the upper end of slit contact 456. The etching process can include one or more cycles of wet etching and/or dry etching.

As illustrated in FIG. 4G, a conductive layer including, for example, copper, is deposited by the same deposition process into the bit line opening and the source line opening to simultaneously form a bit line 462 and a source line 464. A second interconnect layer 466 including second dielectric layer 460, bit line 462, and a source line 464 is thereby formed. A CMP process can be performed to remove the excess conductive layer and planarize the top surface of second interconnect layer 466. The deposition process can include thin film deposition processes, such as ALD, CVD, PVD, any other suitable processes, or any combination thereof. Interconnect structures including local contact layer 446, first interconnect layer 458, and second interconnect layer 566 for channel structure 410 and slit structure 444 is thereby formed.

Figure 7:
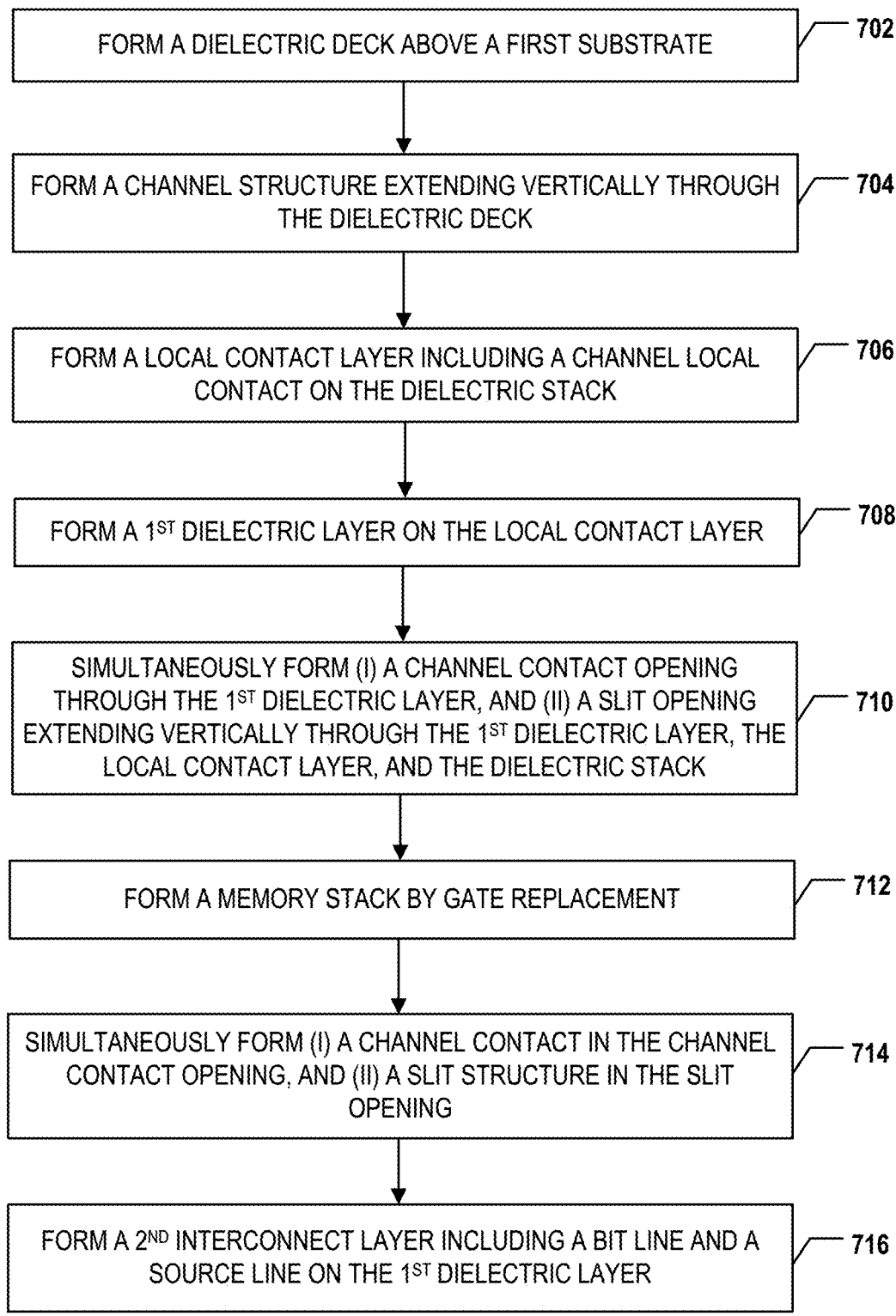
FIG. 7 illustrates a flowchart of a method for forming another exemplary 3D memory device with an interconnect structure, according to some embodiments of the present disclosure.

FIGS. 5A-5G illustrate a fabrication process for forming another exemplary 3D memory device with an interconnect structure, according to some embodiments of the present disclosure. FIG. 7 illustrates a flowchart of a method 700 for forming another exemplary 3D memory device with an interconnect structure, according to some embodiments of the present disclosure. Examples of the 3D memory device depicted in FIGS. 5A-5G and 7 include 3D memory device 300 depicted in FIG. 3. FIGS. 5A-5G and 7 will be described together. It is understood that the operations shown in method 700 are not exhaustive and that other operations can be performed as well before, after, or between any of the illustrated operations. Further, some of the operations may be performed simultaneously, or in a different order than shown in FIG. 7. Moreover, the details of similar fabrication processes in both methods 600 and 700 may not be repeated below.

Figure 5A:
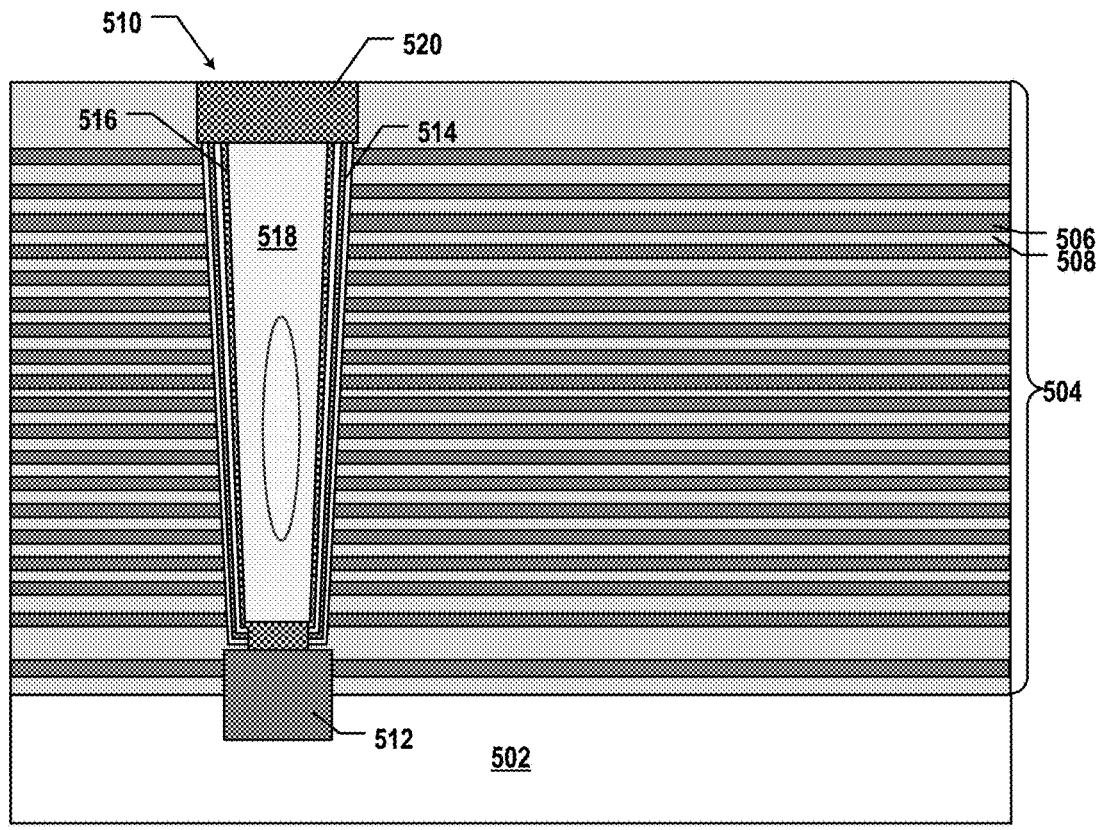
FIGS. 5A-5G illustrate a fabrication process for forming another exemplary 3D memory device with an interconnect structure, according to some embodiments of the present disclosure.
Figure 5A:

Referring to FIG. 7, method 700 starts at operation 702, in which a dielectric stack including interleaved sacrificial layers and dielectric layers above a substrate. The substrate can be a silicon substrate. Referring to FIG. 5A, a dielectric stack 504 including a plurality pairs of a sacrificial layer 506 and a dielectric layer 508 is formed above a silicon substrate 502. Dielectric layers 508 and sacrificial layers 506 can be alternatingly deposited on silicon substrate 502 to form dielectric stack 504. Dielectric stack 504 can be formed by one or more thin film deposition processes including, but not limited to, CVD, PVD, ALD, or any combination thereof.

Method 700 proceeds to operation 704, as illustrated in FIG. 7, in which a channel structure extending vertically through the dielectric stack is formed. In some embodiments, to form the channel structure, a channel hole extending vertically through the dielectric stack is formed, a memory film and a semiconductor channel are subsequently deposited over a sidewall of the channel hole, and a plug is formed above and in contact with the memory film and the semiconductor channel.

As illustrated in FIG. 5A, a channel hole is an opening formed extending vertically through dielectric stack 504. In some embodiments, fabrication processes for forming the channel hole of a channel structure 510 include wet etching and/or dry etching, such as DRIE. In some embodiments, the channel hole of channel structure 510 extends further through the top portion of silicon substrate 502. The etching process through dielectric stack 504 may not stop at the top surface of silicon substrate 502 and may continue to etch part of silicon substrate 502. As illustrated in FIG. 5A, a semiconductor plug 512 can be formed by filling the lower portion of the channel hole with single-crystal silicon epitaxially grown from silicon substrate 502 in any suitable directions (e.g., from the bottom surface and/or side surface). The fabrication processes for epitaxially growing semiconductor plug 512 can include, but not limited to, VPE, LPE, MPE, or any combinations thereof.

As illustrated in FIG. 5A, a memory film 514 (including a blocking layer, a storage layer, and a tunneling layer) and a semiconductor channel 516 are formed along the sidewall of the channel hole of channel structure 510 and above semiconductor plug 512. In some embodiments, memory film 514 is first deposited along the sidewall of the channel hole and above semiconductor plug 512, and semiconductor channel 516 is then deposited over memory film 514. The blocking layer, storage layer, and tunneling layer can be subsequently deposited in this order using one or more thin film deposition processes, such as ALD, CVD, PVD, any other suitable processes, or any combination thereof, to form memory film 514. Semiconductor channel 516 can then be formed by depositing polysilicon on the tunneling layer using one or more thin film deposition processes, such as ALD, CVD, PVD, any other suitable processes, or any combination thereof. Semiconductor channel 516 can be in contact with semiconductor plug 512 using, for example, a SONO punch process. In some embodiments, semiconductor channel 516 is deposited in the channel hole without completely filling the channel hole. As illustrated in FIG. 5A, a capping layer 518, such as a silicon oxide layer, is formed in the channel hole to fully or partially fill the remaining space of the channel hole using one or more thin film deposition processes, such as CVD, PVD, ALD, electroplating, electroless plating, or any combination thereof.

As illustrated in FIG. 5A, a channel plug 520 is formed in the upper portion of the channel hole of channel structure 510. In some embodiments, parts of memory film 514, semiconductor channel 516, and capping layer 518 that are on the top surface of dielectric stack 504 are removed and planarized by CMP, wet etching and/or dry etching. A recess then can be formed in the upper portion of the channel hole by wet etching and/or drying etching parts of memory film 514, semiconductor channel 516, and capping layer 518 in the upper portion of the channel hole. Channel plug 520 then can be formed by depositing semiconductor materials, such as polysilicon, and/or metals, such as tungsten, into the recess by one or more thin film deposition processes, such as CVD, PVD, ALD, electroplating, electroless plating, or any combination thereof. Channel structure 510 is thereby formed through dielectric stack 504.

Method 700 proceeds to operation 706, as illustrated in FIG. 7, in which a local contact layer is formed on the dielectric stack. The local contact layer includes a channel local contact above and in contact with an upper end of the channel structure. The local contact layer is part of the interconnect structure of the 3D memory device to be formed. Different from existing methods for forming 3D memory devices (e.g., 3D memory device 100 in FIG. 1) with an interconnect structure in which the formation of the interconnect structure (including the local dielectric layer) starts after the formation of the slit structure, method 700 forms the local contact layer prior to the formation of the slit structure.

Figure 5B:
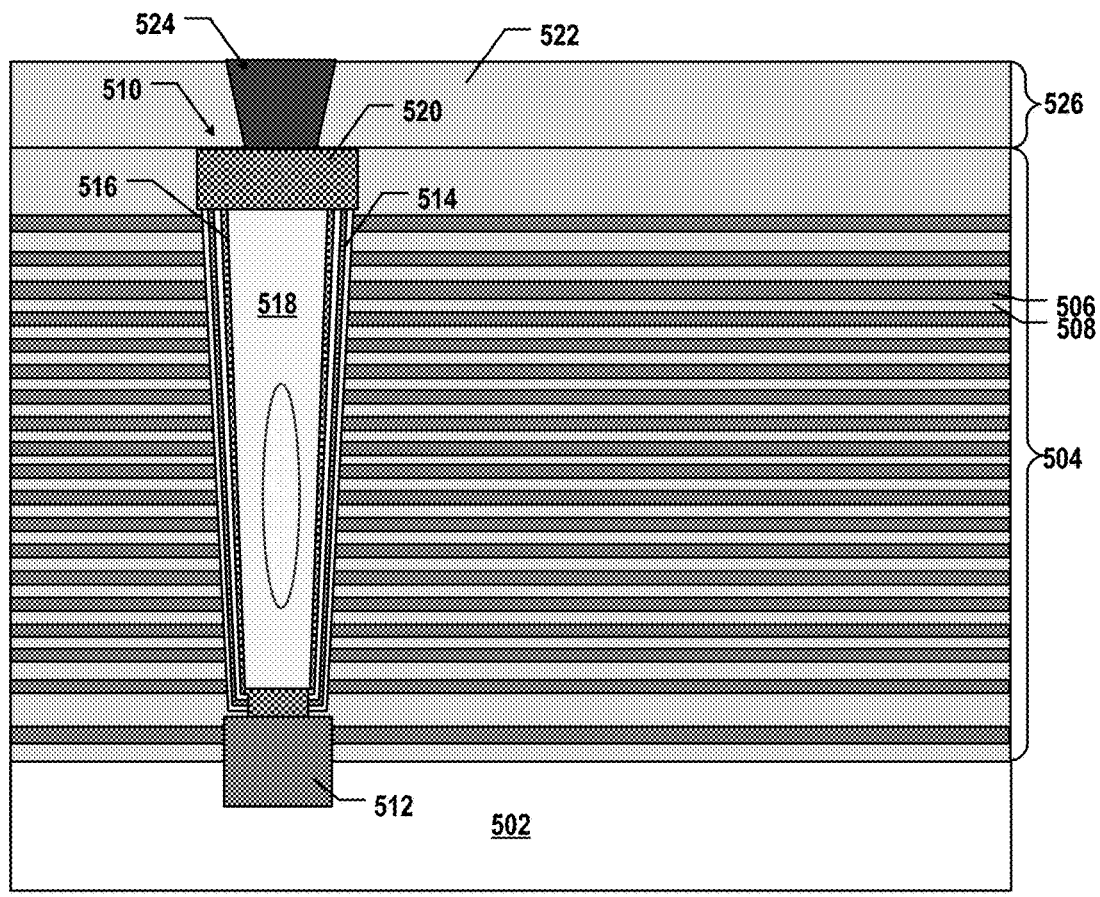

As illustrated in FIG. 5B, a local dielectric layer 522 is formed on dielectric stack 504. Local dielectric layer 522 can be formed by depositing dielectric materials, such as silicon oxide and/or silicon nitride, using one or more thin film deposition processes, such as CVD, PVD, ALD, or any combination thereof, on top of the top surface of dielectric stack 504. In some embodiments, a channel local contact opening is formed through local dielectric layer 522 using an etching process, which stops at the upper end of channel plug 520 of channel structure 510 to expose the upper end of channel plug 520. The etching process can include one or more cycles of wet etching and/or dry etching (e.g., DRIE). The channel local contact opening can be patterned by an etching mask (e.g., photoresist) using photolithography, such that the channel local contact opening is aligned with channel structure 510. As illustrated in FIG. 5B, a conductive layer including, for example, tungsten, is deposited into the channel local contact opening to form a channel local contact 524. A local contact layer 526 including local dielectric layer 522 and channel local contact 524 is thereby formed. A CMP process can be performed to remove the excess conductive layer and planarize the top surface of local contact layer 526. The deposition process can include thin film deposition processes, such as ALD, CVD, PVD, any other suitable processes, or any combination thereof.

Method 700 proceeds to operation 708, as illustrated in FIG. 7, in which a first dielectric layer is formed on the local contact layer. As illustrated in FIG. SC, a first dielectric layer 528 is formed on local dielectric layer 522 of local contact layer 526. First dielectric layer 528 can be formed by depositing dielectric materials, such as silicon oxide and/or silicon nitride, using one or more thin film deposition processes, such as CVD, PVD, ALD, or any combination thereof, on top of the top surface of local contact layer 526

Figure 5C:
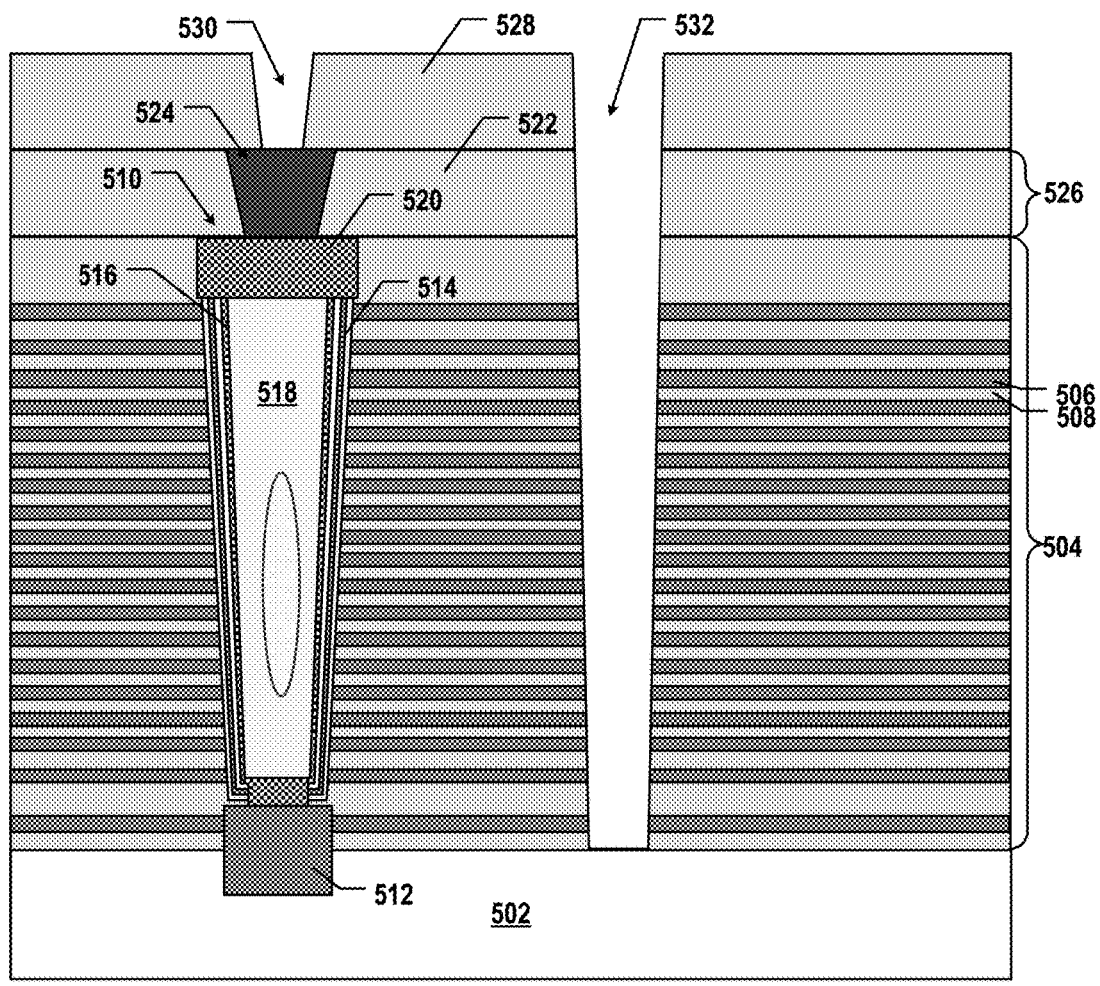

Method 700 proceeds to operation 710, as illustrated in FIG. 7, in which a channel contact opening through the first dielectric layer to expose an upper end of the channel local contact, and a slit opening extending vertically through the first dielectric layer, the local dielectric layer, and the dielectric stack are simultaneously formed. As illustrated in FIG. 5C, a channel contact opening 530 and a slit opening 532 are simultaneously formed using the same etching process. In some embodiments, the same etching process etches channel contact opening 530 through first dielectric layer 528 stopping at the upper end of channel local contact 524 to expose the upper end of channel local contact 524, and also etches slit opening 532 through first dielectric layer 528, local dielectric layer 522, as well as interleaved sacrificial layers 506 and dielectric layers 508 (e.g., silicon nitride layers and silicon oxide layers) of dielectric stack 504 to reach silicon substrate 502. The etching process can include one or more cycles of wet etching and/or dry etching (e.g., DRIE). Channel contact opening 530 and slit opening 532 can be patterned by an etching mask (e.g., photoresist) using photolithography, such that channel contact opening 530 is aligned with channel local contact 524 and slit opening 532 is to be formed at the place where a slit structure is to be formed.

Figure 5D:
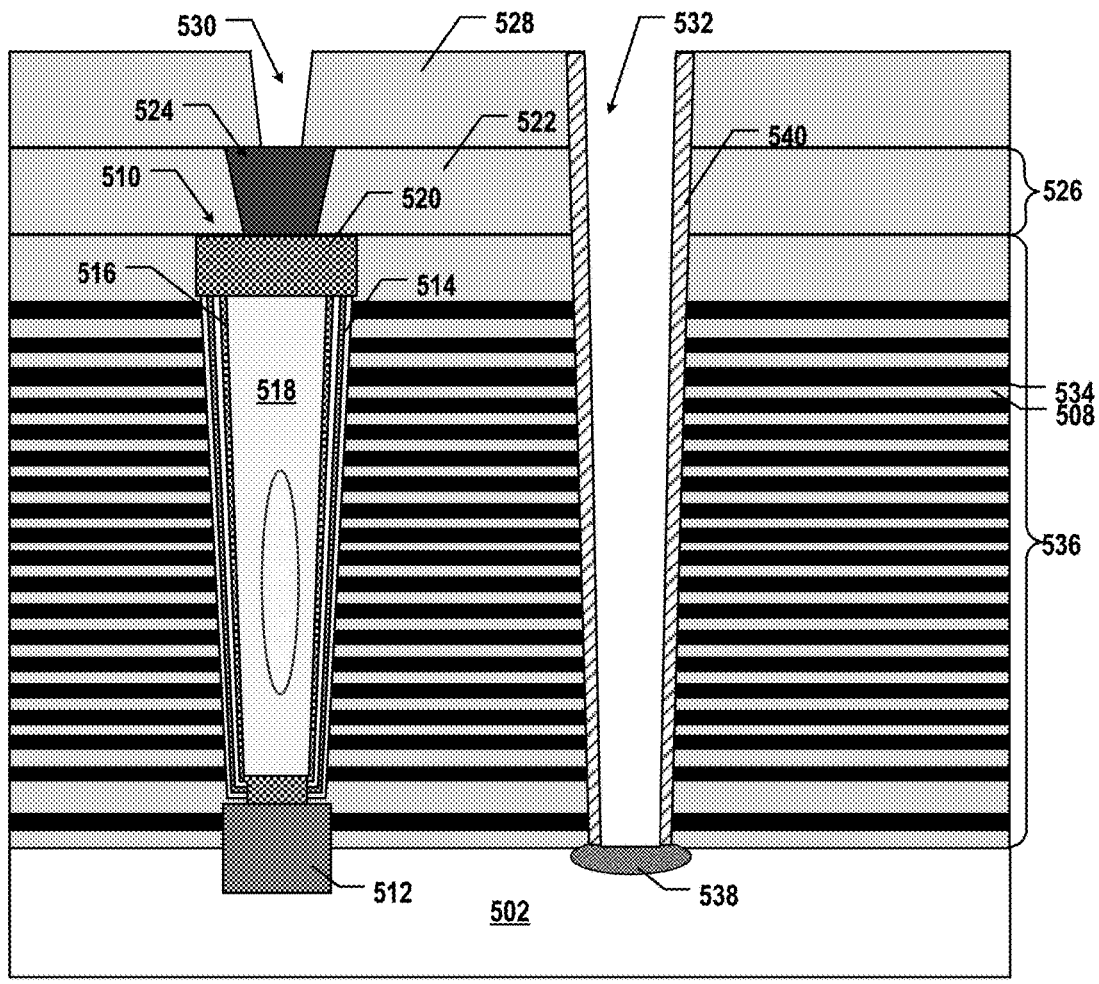

Method 700 proceeds to operation 712, as illustrated in FIG. 7, in which a memory stack including interleaved conductive layers and the dielectric layers is formed by replacing, through the slit opening, the sacrificial layers with the conductive layers (i.e., the so-called "gate replacement" process). As illustrated in FIG. 5D, sacrificial layers 506 (shown in FIG. 5C) are replaced with conductive layers 534, and a memory stack 536 including interleaved conductive layers 534 and dielectric layers 508 is thereby formed.

In some embodiments, lateral recesses (not shown) are first formed by removing sacrificial layers 506 through slit opening 532. In some embodiments, sacrificial layers 506 are removed by applying etching solutions through slit opening 532, such that sacrificial layers 506 are removed, creating the lateral recesses interleaved between dielectric layers 508. As illustrated in FIG. 5D, conductive layers 534 are deposited into the lateral recesses through slit opening 532. Conductive layers 534, such as metal layers, can be deposited using one or more thin film deposition processes, such as ALD, CVD, PVD, any other suitable processes, or any combination thereof.

Method 700 proceeds to operation 714, as illustrated in FIG. 7, in which a channel contact in the channel contact opening, and a slit structure in the slit opening are simultaneously formed. In some embodiments, to simultaneously form the channel contact and the slit structure, a conductive layer is simultaneously deposited in the channel contact opening and the slit opening. The conductive layer can include tungsten.

As illustrated in FIG. 5D, prior to the deposition of the conductive layer, a doped region 538 can be formed at the lower end of slit opening 532 (in silicon substrate 502) and a spacer 540 can be formed over the sidewall of slit opening 532. Doped region 538 can be formed by ion implantation and/or thermal diffusion to dope P-type or N-type dopants into part of silicon substrate 502 exposed through slit opening 532. Spacer 540 including one or more dielectric layers, such as silicon oxide and silicon nitride, is deposited along the sidewall of slit opening 532 using one or more thin film deposition processes, such as ALD, CVD, PVD, any other suitable processes, or any combination thereof, according to some embodiments.

Figure 5E:
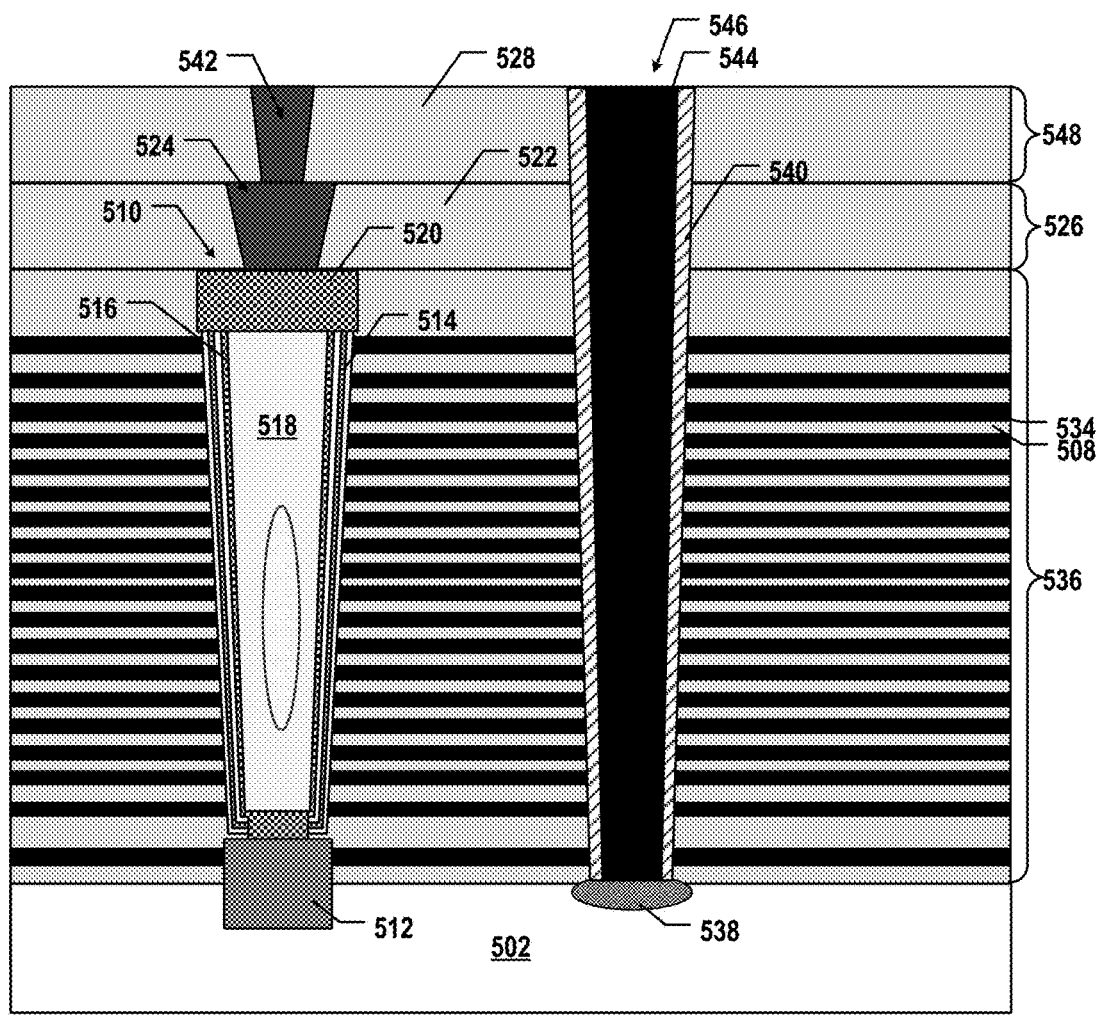

As illustrated in FIG. 5E, a conductive layer including, for example, tungsten, is deposited by the same deposition process into channel contact opening 530 (shown in FIG. 5D) and the remaining space of slit opening 532 (shown in FIG. 5D) to simultaneously form a channel contact 542 and a source conductive layer 544. A first interconnect layer 548 including first dielectric layer 528 and channel contact 542 is thereby formed. A CMP process can be performed to remove the excess conductive layer and planarize the top surface of first interconnect layer 548. A slit structure 546 including source conductive layer 544, spacer 540, and doped region 538 is thereby simultaneously formed with channel contact 542. The deposition process can include thin film deposition processes, such as ALD, CVD, PVD, any other suitable processes, or any combination thereof. In some embodiments, a polysilicon layer is deposited into slit opening 532 first prior to the simultaneous deposition of the conductive layer (e.g., tungsten) into channel contact opening 530 and slit opening 532. Slit structure 546 extends through first interconnect layer 548 and local contact layer 526 as well, according to some embodiments as shown in FIG. 5E.

Method 700 proceeds to operation 716, as illustrated in FIG. 7, in which a second interconnect layer is formed on the first dielectric layer. The second interconnect layer includes a bit line above and in contact with an upper end of the channel contact, and a source line above and in contact with an upper end of the slit structure. In some embodiments, to form the second interconnect layer, a second dielectric layer is formed on the first dielectric layer. In some embodiments, to form the second interconnect layer, a bit line opening through the second dielectric layer to expose the upper end of the channel contact, and a source line opening through the second dielectric layer to expose the upper end of the slit structure are simultaneously formed. In some embodiments, to form the second interconnect layer, a conductive layer is simultaneously deposited in the bit line opening and the source line opening. The conductive layer can include copper.

Figure 5F:
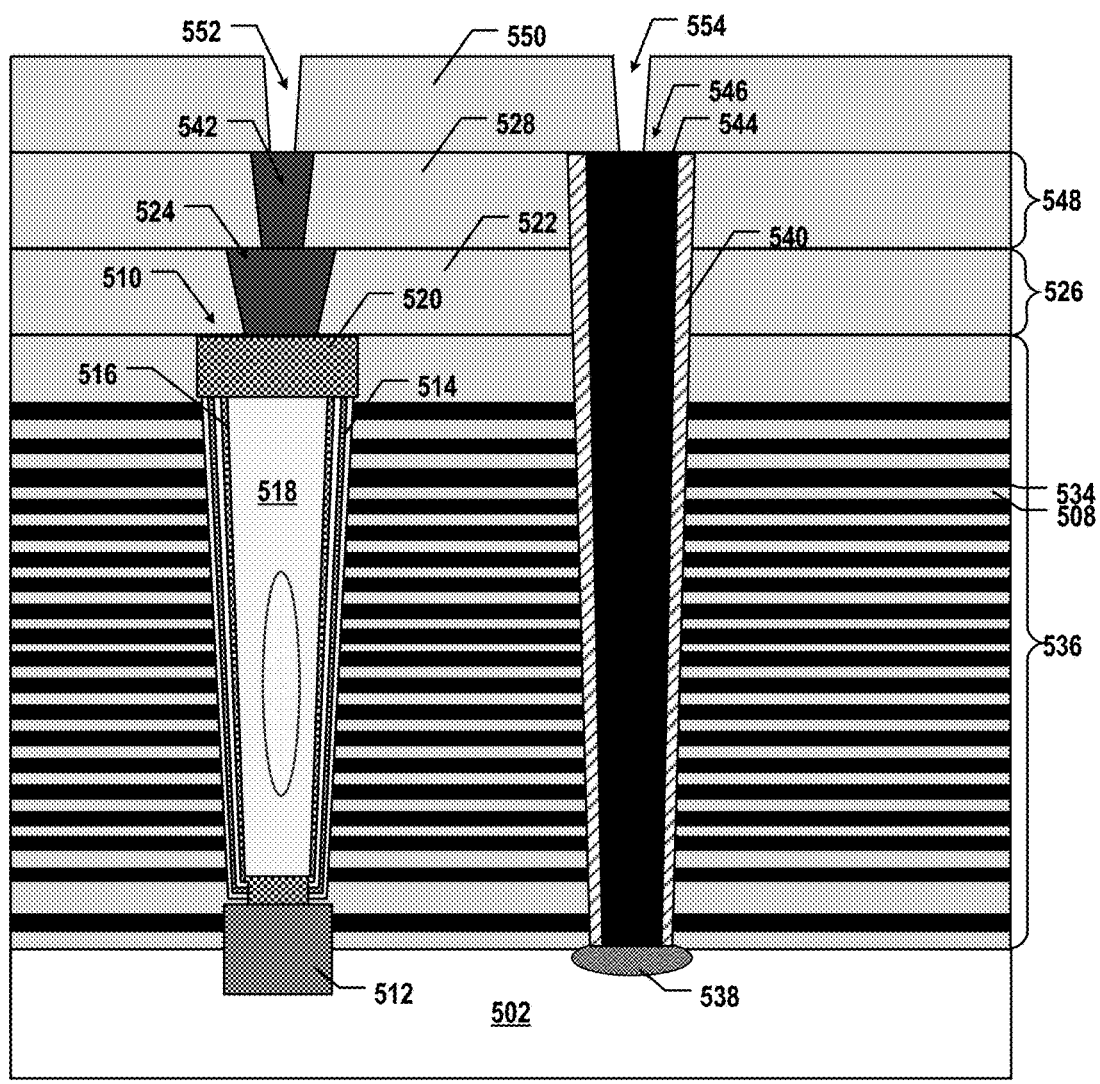

As illustrated in FIG. 5F, a second dielectric layer 550 is formed on first dielectric layer 528 of first interconnect layer 548. Second dielectric layer 550 can be formed by depositing dielectric materials, such as silicon oxide and/or silicon nitride, using one or more thin film deposition processes, such as CVD, PVD, ALD, or any combination thereof, on top of the top surface of first dielectric layer 528 of first interconnect layer 548. In some embodiments, a bit line opening 552 and a source line opening 554 are simultaneously formed through second dielectric layer 550 using the same etching process. In some embodiments, the same etching process etches bit line opening 552 through second dielectric layer 550 stopping at the upper end of channel contact 542 to expose the upper end of channel contact 542, and also etches source line opening 554 through second dielectric layer 550 stopping at the upper end of slit structure 546 to expose the upper end of slit structure 546. The etching process can include one or more cycles of wet etching and/or dry etching.

Figure 5G:
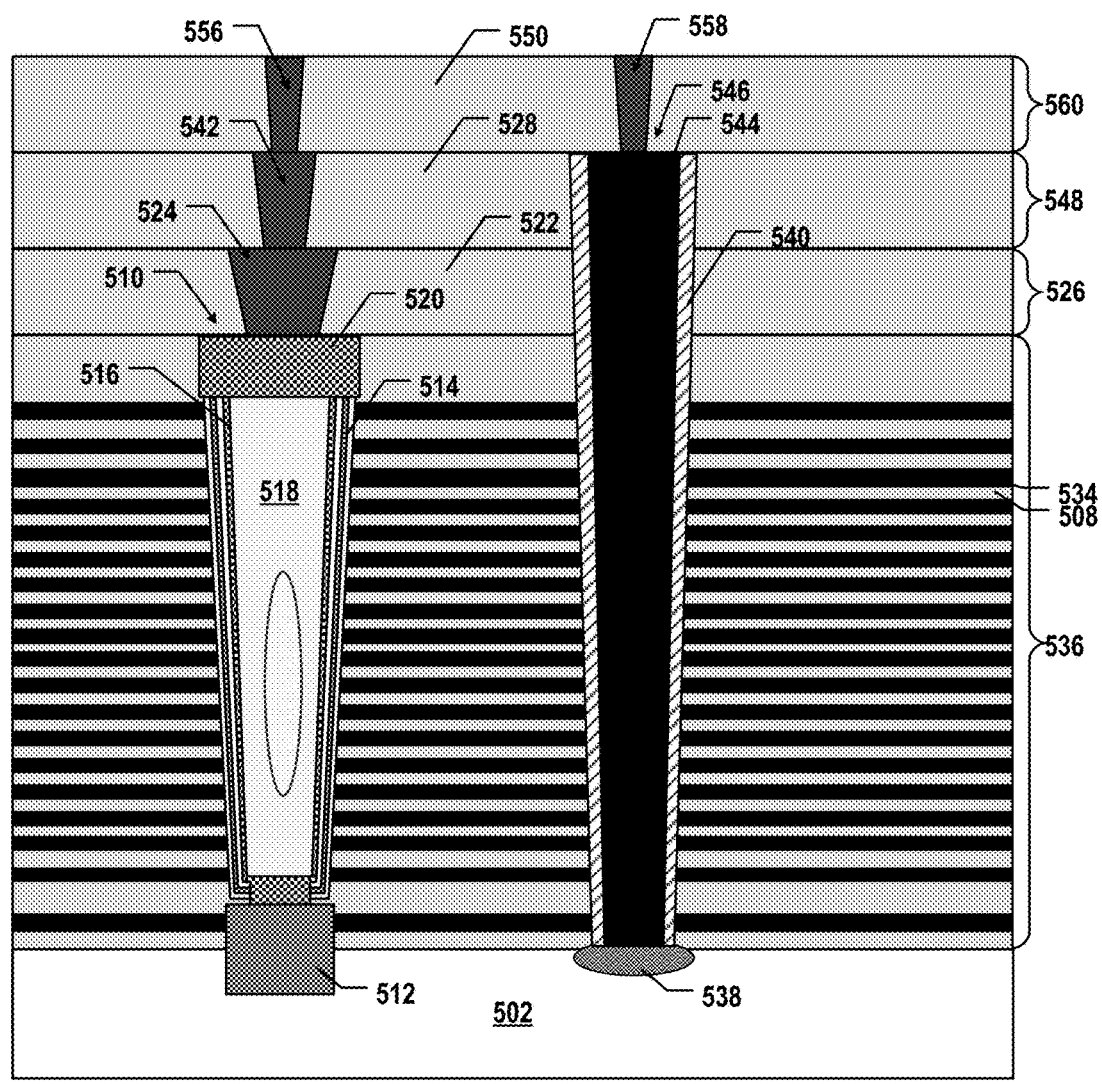

As illustrated in FIG. 5G, a conductive layer including, for example, copper, is deposited by the same deposition process into bit line opening 552 (shown in FIG. 5F) and source line opening 554 (shown in FIG. 5F) to simultaneously form a bit line 556 and a source line 558. A second interconnect layer 560 including second dielectric layer 550, bit line 556, and a source line 558 is thereby formed. A CMP process can be performed to remove the excess conductive layer and planarize the top surface of second interconnect layer 560. The deposition process can include thin film deposition processes, such as ALD, CVD, PVD, any other suitable processes, or any combination thereof. Interconnect structures including local contact layer 526, first interconnect layer 548, and second interconnect layer 560 for channel structure 510 and slit structure 546 is thereby formed.

According to one aspect of the present disclosure, a 3D memory device includes a substrate, a memory stack, a channel structure, and a slit structure. The memory stack includes interleaved conductive layers and dielectric layers above the substrate. The channel structure extends vertically through the memory stack. The slit structure extends vertically through the memory stack. An upper end of the slit structure is above an upper end of the channel structure.

In some embodiments, the 3D memory device further includes a local contact layer on the memory stack. The local contact layer includes a channel local contact above and in contact with the upper end of the channel structure, and the slit structure extends vertically through the local contact layer, according to some embodiments.

In some embodiments, the 3D memory device further includes a first interconnect layer on the local contact layer. The first interconnect layer includes a channel contact above and in contact with the channel local contact, according to some embodiments.

In some embodiments, the 3D memory device further includes a second interconnect layer on the first interconnect layer. The second interconnect layer includes a bit line above and in contact with the channel contact, according to some embodiments.

In some embodiments, the upper end of the slit structure is flush with an upper end of the channel local contact, and the first interconnect layer further includes a slit contact above and in contact with the upper end of the slit structure.

In some embodiments, the second interconnect layer further includes a source line above and in contact with an upper end of the slit contact.

In some embodiments, the slit structure includes a source conductive layer in contact with the slit contact at the upper end of the slit structure, and a spacer between the source conductive layer and the conductive layers of the memory stack.

In some embodiments, the upper end of the slit structure is flush with an upper end of the channel contact, and the slit structure extends vertically through the first interconnect layer.

In some embodiments, the second interconnect layer further includes a source line above and in contact with the upper end of the slit structure.

In some embodiments, the slit structure includes a source conductive layer in contact with the source line at the upper end of the slit structure, and a spacer between the source conductive layer and the conductive layers of the memory stack.

In some embodiments, the channel structure includes a semiconductor channel and a memory film. In some embodiments, the channel structure further includes a plug at the upper end of the channel structure and in contact with the channel local contact.

According to another aspect of the present disclosure, a method for forming a 3D memory device is disclosed. A dielectric stack including interleaved sacrificial layers and dielectric layers is formed above a substrate. A channel structure extending vertically through the dielectric stack is formed. A local dielectric layer is formed on the dielectric stack. A channel local contact opening through the local dielectric layer to expose an upper end of the channel structure, and a slit opening extending vertically through the local dielectric layer and the dielectric stack are simultaneously formed. A memory stack including interleaved conductive layers and the dielectric layers is formed by replacing, through the slit opening, the sacrificial layers with the conductive layers. A channel local contact in the channel local contact opening, and a slit structure in the slit opening are simultaneously formed.

In some embodiments, a first interconnect layer is formed on the local dielectric layer. The first interconnect layer includes a channel contact above and in contact with an upper end of the channel local contact, and a slit contact above and in contact with an upper end of the slit structure, according to some embodiments.

In some embodiments, to form the first interconnect layer, a first dielectric layer is formed on the local dielectric layer, a channel contact opening through the first dielectric layer to expose the upper end of the channel local contact, and a slit contact opening through the first dielectric layer to expose the upper end of the slit structure are simultaneously formed, and a conductive layer is simultaneously deposited in the channel contact opening and the slit contact opening.

In some embodiments, a second interconnect layer is formed on the first interconnect layer. The second interconnect layer includes a bit line above and in contact with an upper end of the channel contact, and a source line above and in contact with an upper end of the slit contact, according to some embodiments.

In some embodiments, to form the channel structure, a channel hole extending vertically through the dielectric stack is etched, a memory film and a semiconductor channel are subsequently deposited over a sidewall of the channel hole, and a plug is formed above and in contact with the memory film and the semiconductor channel.

In some embodiments, to simultaneously form the channel local contact and the slit structure, a conductive layer is simultaneously deposited in the channel local contact opening and the slit opening. In some embodiments, the conductive layer includes tungsten.

According to still another aspect of the present disclosure, a method for forming a 3D memory device is disclosed. A dielectric stack including interleaved sacrificial layers and dielectric layers is formed above a substrate. A channel structure extending vertically through the dielectric stack is formed. A local contact layer is formed on the dielectric stack. The local contact layer includes a channel local contact above and in contact with an upper end of the channel structure. A first dielectric layer is formed on the local contact layer. A channel contact opening through the first dielectric layer to expose an upper end of the channel local contact, and a slit opening extending vertically through the first dielectric layer, the local contact layer, and the dielectric stack are simultaneously formed. A memory stack including interleaved conductive layers and the dielectric layers is formed by replacing, through the slit opening, the sacrificial layers with the conductive layers. A channel contact in the channel contact opening, and a slit structure in the slit opening are simultaneously formed.

In some embodiments, a second interconnect layer is formed on the first dielectric layer. The second interconnect layer includes a bit line above and in contact with an upper end of the channel contact, and a source line above and in contact with an upper end of the slit structure.

In some embodiments, to form the second interconnect layer, a second dielectric layer is formed on the first dielectric layer, a bit line opening through the second dielectric layer to expose the upper end of the channel contact, and a source line opening through the second dielectric layer to expose the upper end of the slit structure are simultaneously formed, and a conductive layer is simultaneously deposited in the bit line opening and the source line opening. In some embodiments, the conductive layer includes copper.

In some embodiments, to form the channel structure, a channel hole extending vertically through the dielectric stack is etched, a memory film and a semiconductor channel are subsequently deposited over a sidewall of the channel hole, and a plug is formed above and in contact with the memory film and the semiconductor channel.

In some embodiments, to simultaneously form the channel contact and the slit structure, a conductive layer is simultaneously deposited in the channel contact opening and the slit opening. In some embodiments, the conductive layer includes tungsten.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a memory stack comprising interleaved conductive layers and dielectric layers;
a channel structure extending vertically through the memory stack;
a single local contact layer on the memory stack and comprising a channel local contact above and in contact with an upper end of the channel structure; and
a slit structure extending vertically through the memory stack and the single local contact layer,
wherein an upper end of the slit structure is flush with an upper end of the channel local contact, and
the slit structure comprises a source conductive layer that comprises polysilicon in a lower portion and a metal in an upper portion.

2. The 3D memory device of claim 1, further comprising a first interconnect layer on the single local contact layer, wherein the first interconnect layer comprises a channel contact above and in contact with the channel local contact.

3. The 3D memory device of claim 2, further comprising a second interconnect layer on the first interconnect layer, wherein the second interconnect layer comprises a bit line above and in contact with the channel contact.

4. The 3D memory device of claim 3, wherein
the upper end of the slit structure is flush with an upper end of the single local contact layer; and
the first interconnect layer further comprises a slit contact above and in contact with the upper end of the slit structure.

5. The 3D memory device of claim 4, wherein the second interconnect layer further comprises a source line above and in contact with the upper end of the slit contact.

6. The 3D memory device of claim 5, wherein the slit structure comprises:
a source conductive layer in contact with the slit contact at the upper end of the slit structure; and
a spacer between the source conductive layer and the conductive layers of the memory stack.

7. The 3D memory device of claim 1, wherein the channel structure comprises a semiconductor channel and a memory film.

8. The 3D memory device of claim 1, wherein the channel structure further comprises a plug at the upper end of the channel structure and in contact with the channel local contact.

9. The 3D memory device of claim 1, wherein the metal comprises at least one of tungsten, cobalt, aluminum, or silicides.

10. The 3D memory device of claim 1, wherein the channel local contact comprises Cu, Al, W, Co, silicides, or a combination thereof.

11. The 3D memory device of claim 1, wherein the single local contact layer comprises silicon oxide, silicon nitride, silicon oxynitride, low dielectric constant (low-k) dielectrics, or a combination thereof.

* * * * *